(12) United States Patent
Ahn et al.

(10) Patent No.: US 7,402,516 B2
(45) Date of Patent: Jul. 22, 2008

(54) METHOD FOR MAKING INTEGRATED CIRCUITS

(75) Inventors: Kie Y. Ahn, Chappaqua, NY (US); Leonard Forbes, Corvallis, OR (US)

(73) Assignee: Micron Technology, Inc., Boise, ID (US)

(*) Notice: Subject to any disclaimer, the term of this patent is extended or adjusted under 35 U.S.C. 154(b) by 187 days.

(21) Appl. No.: 11/457,099

(22) Filed: Jul. 12, 2006

(65) Prior Publication Data

US 2006/0246733 A1    Nov. 2, 2006

Related U.S. Application Data

(63) Continuation of application No. 09/484,303, filed on Jan. 18, 2000, now Pat. No. 7,262,130.

(51) Int. Cl.
*H01L 21/4763* (2006.01)

(52) U.S. Cl. .............................. 438/643; 257/E21.584

(58) Field of Classification Search ................ 438/643; 257/E21.584

See application file for complete search history.

(56) References Cited

U.S. PATENT DOCUMENTS

| | | | |
|---|---|---|---|
| 1,254,987 A | 1/1918 | Cooper |
| 1,976,375 A | 10/1934 | Smith |
| 2,244,608 A | 6/1941 | Cooper |
| 2,842,438 A | 7/1958 | Saarivirta et al. |
| 3,147,110 A | 9/1964 | Foerster |

(Continued)

FOREIGN PATENT DOCUMENTS

EP    0304046    2/1989

(Continued)

OTHER PUBLICATIONS

U.S. Appl. No. 60/114,039, filed Dec. 29, 1998, Havemann, H. R., et al.

(Continued)

*Primary Examiner*—W. David Coleman
(74) *Attorney, Agent, or Firm*—Schwegman, Lundberg & Woessner, P.A.

(57) ABSTRACT

Integrated circuits, the key components in thousands of electronic and computer products, include interconnected networks of electrical components. The components are typically wired, or interconnected, together with aluminum wires. In recent years, researchers have begun using copper instead of aluminum to form integrated-circuit wiring, because copper offers lower electrical resistance and better reliability at smaller dimensions. However, copper typically requires use of a diffusion barrier to prevent it from contaminating other parts of an integrated circuit. Unfortunately, typical diffusion barrier materials add appreciable resistance to the copper wiring, and thus negate some advantages of using copper. Moreover, conventional methods of forming the copper wiring are costly and time consuming. Accordingly, the inventors devised one or more exemplary methods for making integrated-circuit wiring from materials, such as copper-, silver-, and gold-based metals. One exemplary method removes two or more masks in a single removal procedure, forms a low-resistance diffusion barrier on two or more wiring levels in a single formation procedure, and fills insulative material around and between two or more wiring levels in a single fill procedure. This and other embodiments hold the promise of simplifying fabrication of integrated-circuit wiring dramatically.

30 Claims, 4 Drawing Sheets

U.S. PATENT DOCUMENTS

| | | | |
|---|---|---|---|
| 3,337,334 A | 8/1967 | Fenn et al. | |
| 3,506,438 A | 4/1970 | Krock et al. | |
| 3,548,915 A | 12/1970 | Richmond et al. | |
| 3,548,948 A | 12/1970 | Richmond et al. | |
| 3,687,737 A | 8/1972 | Krock et al. | |
| 3,832,456 A | 8/1974 | Kobetz et al. | |
| 3,923,500 A | 12/1975 | Kitazawa et al. | |
| 3,932,226 A | 1/1976 | Klatskin et al. | |
| 3,954,570 A | 5/1976 | Shirk et al. | |
| 4,022,931 A | 5/1977 | Black et al. | |
| 4,029,377 A | 6/1977 | Guglielmi | |
| 4,065,330 A | 12/1977 | Masumoto et al. | |
| 4,101,855 A | 7/1978 | Drapeau | |
| 4,158,719 A | 6/1979 | Frantz | |
| 4,213,818 A | 7/1980 | Lemons et al. | |
| 4,233,066 A | 11/1980 | Sundin et al. | |
| 4,314,594 A | 2/1982 | Pfeifer et al. | |
| 4,386,116 A | 5/1983 | Nair et al. | |
| 4,389,429 A | 6/1983 | Soclof | |
| 4,394,223 A | 7/1983 | Hall | |
| 4,423,547 A | 1/1984 | Farrar et al. | |
| 4,561,173 A | 12/1985 | Te Velde | |
| 4,565,157 A | 1/1986 | Brors et al. | |
| 4,574,095 A | 3/1986 | Baum et al. | |
| 4,670,297 A | 6/1987 | Lee et al. | |
| 4,709,359 A | 11/1987 | Loftin | |
| 4,762,728 A | 8/1988 | Keyser et al. | |
| 4,788,082 A | 11/1988 | Schmitt | |
| 4,824,544 A | 4/1989 | Mikalesen et al. | |
| 4,847,111 A | 7/1989 | Chow et al. | |
| 4,857,481 A | 8/1989 | Tam et al. | |
| 4,931,410 A | 6/1990 | Tokunaga et al. | |
| 4,933,743 A | 6/1990 | Thomas et al. | |
| 4,948,459 A | 8/1990 | Van Laarhoven et al. | |
| 4,962,058 A | 10/1990 | Cronin et al. | |
| 4,996,584 A | 2/1991 | Young et al. | |
| 5,000,818 A | 3/1991 | Thomas et al. | |
| 5,019,531 A | 5/1991 | Awaya et al. | |
| 5,034,799 A | 7/1991 | Tomita et al. | |
| 5,045,635 A | 9/1991 | Kaplo et al. | |
| 5,071,518 A | 12/1991 | Pan | |
| 5,084,412 A | 1/1992 | Nakasaki | |
| 5,100,499 A | 3/1992 | Douglas | |
| 5,130,274 A | 7/1992 | Harper et al. | |
| 5,148,260 A | 9/1992 | Inoue et al. | |
| 5,149,615 A | 9/1992 | Chakravorty et al. | |
| 5,158,986 A | 10/1992 | Cha et al. | |
| 5,171,712 A | 12/1992 | Wang et al. | |
| 5,171,713 A | 12/1992 | Matthews | |
| 5,173,442 A | 12/1992 | Carey | |
| 5,227,658 A | 7/1993 | Beyer et al. | |
| 5,231,036 A | 7/1993 | Miyauchi et al. | |
| 5,231,056 A | 7/1993 | Sandhu | |
| 5,232,866 A | 8/1993 | Beyer et al. | |
| 5,240,878 A | 8/1993 | Fitzsimmons et al. | |
| 5,243,222 A | 9/1993 | Harper et al. | |
| 5,256,205 A | 10/1993 | Schmitt, III et al. | |
| 5,268,315 A | 12/1993 | Prasad et al. | |
| 5,308,440 A | 5/1994 | Chino et al. | |
| 5,324,683 A | 6/1994 | Fitch et al. | |
| 5,324,684 A | 6/1994 | Kermani et al. | |
| 5,334,356 A | 8/1994 | Baldwin et al. | |
| 5,336,914 A | 8/1994 | Andoh | |
| 5,348,811 A | 9/1994 | Nagao et al. | |
| 5,354,712 A | 10/1994 | Ho et al. | |
| 5,356,672 A | 10/1994 | Schmitt, III et al. | |
| 5,371,042 A | 12/1994 | Ong | |
| 5,374,849 A | 12/1994 | Tada | |
| 5,384,284 A | 1/1995 | Doan et al. | |
| 5,399,897 A | 3/1995 | Cunningham et al. | |
| 5,401,680 A | 3/1995 | Abt et al. | |
| 5,408,742 A | 4/1995 | Zaidel et al. | |
| 5,413,687 A | 5/1995 | Barton et al. | |
| 5,413,962 A | 5/1995 | Lur et al. | |
| 5,424,030 A | 6/1995 | Takahashi | |
| 5,426,330 A | 6/1995 | Joshi et al. | |
| 5,442,237 A | 8/1995 | Hughes et al. | |
| 5,444,015 A | 8/1995 | Aitken et al. | |
| 5,447,887 A | 9/1995 | Filipiak et al. | |
| 5,451,804 A | 9/1995 | Lur et al. | |
| 5,457,344 A | 10/1995 | Bartelink | |
| 5,461,243 A | 10/1995 | Ek et al. | |
| 5,470,789 A | 11/1995 | Misawa | |
| 5,470,801 A | 11/1995 | Kapoor et al. | |
| 5,476,817 A | 12/1995 | Numata | |
| 5,485,037 A | 1/1996 | Marrs | |
| 5,495,667 A | 3/1996 | Farnworth et al. | |
| 5,506,449 A | 4/1996 | Nakano et al. | |
| 5,510,645 A | 4/1996 | Fitch et al. | |
| 5,529,956 A | 6/1996 | Morishita | |
| 5,534,731 A | 7/1996 | Cheung | |
| 5,538,922 A | 7/1996 | Cooper et al. | |
| 5,539,060 A | 7/1996 | Tsunogae et al. | |
| 5,539,227 A | 7/1996 | Nakano | |
| 5,578,146 A | 11/1996 | Grant et al. | |
| 5,595,937 A | 1/1997 | Mikagi | |
| 5,609,721 A | 3/1997 | Tsukune et al. | |
| 5,625,232 A | 4/1997 | Numata et al. | |
| 5,625,233 A | 4/1997 | Cabral, Jr. et al. | |
| 5,633,200 A | 5/1997 | Hu | |
| 5,635,253 A | 6/1997 | Canaperi et al. | |
| 5,635,423 A | 6/1997 | Huang et al. | |
| 5,654,245 A | 8/1997 | Allen | |
| 5,662,788 A | 9/1997 | Sandhu et al. | |
| 5,667,600 A | 9/1997 | Grensing et al. | |
| 5,668,398 A | 9/1997 | Havemann et al. | |
| 5,670,420 A | 9/1997 | Choi | |
| 5,674,787 A | 10/1997 | Zhao et al. | |
| 5,675,187 A | 10/1997 | Numata et al. | |
| 5,679,608 A | 10/1997 | Cheung et al. | |
| 5,681,441 A | 10/1997 | Svendsen et al. | |
| 5,693,563 A | 12/1997 | Teong | |
| 5,695,810 A | 12/1997 | Dubin et al. | |
| 5,705,425 A | 1/1998 | Miura et al. | |
| 5,719,089 A | 2/1998 | Cherng et al. | |
| 5,719,410 A | 2/1998 | Suehiro et al. | |
| 5,719,447 A | 2/1998 | Gardner | |
| 5,725,689 A | 3/1998 | Nishida et al. | |
| 5,739,579 A | 4/1998 | Chiang et al. | |
| 5,763,953 A | 6/1998 | IIjima et al. | |
| 5,780,358 A | 7/1998 | Zhou | |
| 5,785,570 A | 7/1998 | Bruni | |
| 5,789,264 A | 8/1998 | Chung | |
| 5,792,522 A | 8/1998 | Jin et al. | |
| 5,792,706 A | 8/1998 | Michael et al. | |
| 5,801,098 A | 9/1998 | Fiordalice et al. | |
| 5,814,557 A | 9/1998 | Venkatraman et al. | |
| 5,821,168 A | 10/1998 | Jain | |
| 5,824,599 A | 10/1998 | Schacham-Diamond et al. | |
| 5,840,625 A | 11/1998 | Feldner | |
| 5,852,871 A | 12/1998 | Khandros | |
| 5,858,877 A | 1/1999 | Dennison et al. | |
| 5,880,018 A | 3/1999 | Boeck et al. | |
| 5,889,295 A | 3/1999 | Rennie et al. | |
| 5,891,797 A | 4/1999 | Farrar | |
| 5,891,804 A | 4/1999 | Havemann et al. | |
| 5,893,752 A | 4/1999 | Zhang et al. | |
| 5,895,740 A | 4/1999 | Chien et al. | |
| 5,897,370 A | 4/1999 | Joshi et al. | |
| 5,899,740 A | 5/1999 | Kwon | |
| 5,900,668 A | 5/1999 | Wollesen | |
| 5,907,772 A | 5/1999 | Iwasaki | |
| 5,911,113 A | 6/1999 | Yao et al. | |
| 5,913,147 A | 6/1999 | Dubin et al. | |

| | | | | | | |
|---|---|---|---|---|---|---|
| 5,925,930 A | 7/1999 | Farnworth et al. | | 6,150,261 A | 11/2000 | Hsu et al. |
| 5,930,596 A | 7/1999 | Klose et al. | | 6,153,507 A | 11/2000 | Mikagi |
| 5,930,669 A | 7/1999 | Uzoh | | 6,159,769 A | 12/2000 | Farnworth et al. |
| 5,932,928 A | 8/1999 | Clampitt | | 6,159,842 A | 12/2000 | Chang et al. |
| 5,933,758 A | 8/1999 | Jain | | 6,162,583 A | 12/2000 | Yang et al. |
| 5,939,771 A | 8/1999 | Usami | | 6,168,704 B1 | 1/2001 | Brown et al. |
| 5,940,733 A | 8/1999 | Beinglass et al. | | 6,169,024 B1 | 1/2001 | Hussein |
| 5,948,467 A | 9/1999 | Nguyen et al. | | 6,171,661 B1 | 1/2001 | Zheng et al. |
| 5,953,626 A | 9/1999 | Hause et al. | | 6,174,800 B1 | 1/2001 | Jang |
| 5,962,923 A | 10/1999 | Xu et al. | | 6,174,804 B1 | 1/2001 | Hsu |
| 5,968,327 A | 10/1999 | Kobayashi et al. | | 6,177,350 B1 | 1/2001 | Sundarrajan et al. |
| 5,968,333 A | 10/1999 | Nogami et al. | | 6,181,012 B1 | 1/2001 | Edelstein et al. |
| 5,969,398 A | 10/1999 | Murakami | | 6,183,564 B1 | 2/2001 | Reynolds et al. |
| 5,969,422 A | 10/1999 | Ting et al. | | 6,184,121 B1 | 2/2001 | Buchwalter et al. |
| 5,972,179 A | 10/1999 | Chittipeddi et al. | | 6,187,656 B1 | 2/2001 | Lu et al. |
| 5,972,804 A | 10/1999 | Tobin et al. | | 6,190,732 B1 | 2/2001 | Omstead et al. |
| 5,976,710 A | 11/1999 | Sachdev et al. | | 6,194,233 B1 | 2/2001 | Bedner et al. |
| 5,981,350 A | 11/1999 | Geusic et al. | | 6,194,317 B1 | 2/2001 | Kaisaki et al. |
| 5,985,759 A | 11/1999 | Kim et al. | | 6,197,181 B1 | 3/2001 | Chen |
| 5,985,762 A | 11/1999 | Geffken et al. | | 6,197,688 B1 | 3/2001 | Simpson |
| 5,989,623 A | 11/1999 | Chen et al. | | 6,204,065 B1 | 3/2001 | Ochiai |
| 5,994,776 A | 11/1999 | Fang et al. | | 6,204,096 B1 | 3/2001 | Lai et al. |
| 5,994,777 A | 11/1999 | Farrar | | 6,207,222 B1 | 3/2001 | Chen et al. |
| 6,001,730 A | 12/1999 | Farkas et al. | | 6,207,553 B1 | 3/2001 | Buynoski et al. |
| 6,002,175 A | 12/1999 | Maekawa | | 6,207,558 B1 | 3/2001 | Singhvi et al. |
| 6,004,884 A | 12/1999 | Abraham | | 6,208,016 B1 | 3/2001 | Farrar |
| 6,008,117 A | 12/1999 | Hong et al. | | 6,211,049 B1 | 4/2001 | Farrar |
| 6,015,465 A | 1/2000 | Kholodenko et al. | | 6,211,071 B1 | 4/2001 | Lukanc et al. |
| 6,015,738 A | 1/2000 | Levy et al. | | 6,211,073 B1 | 4/2001 | Ahn |
| 6,016,000 A | 1/2000 | Moslehi | | 6,211,561 B1 | 4/2001 | Zhao |
| 6,017,820 A | 1/2000 | Ting et al. | | 6,214,719 B1 | 4/2001 | Nag |
| 6,020,243 A | 2/2000 | Wallace et al. | | 6,215,186 B1 | 4/2001 | Konecni et al. |
| 6,022,802 A | 2/2000 | Jang | | 6,218,282 B1 | 4/2001 | Buynoski |
| 6,025,261 A | 2/2000 | Farrar et al. | | 6,221,763 B1 | 4/2001 | Gilton |
| 6,028,362 A | 2/2000 | Omura | | 6,224,690 B1 | 5/2001 | Andricacos et al. |
| 6,030,877 A | 2/2000 | Lee et al. | | 6,228,754 B1 | 5/2001 | Iacoponi et al. |
| 6,030,895 A | 2/2000 | Joshi et al. | | 6,232,219 B1 | 5/2001 | Blalock et al. |
| 6,037,248 A | 3/2000 | Ahn | | 6,232,230 B1 | 5/2001 | Iacoponi |
| 6,037,664 A | 3/2000 | Zhao et al. | | 6,239,017 B1 | 5/2001 | Lou et al. |
| 6,051,858 A | 4/2000 | Uchida et al. | | 6,245,658 B1 | 6/2001 | Buynoski |
| 6,054,172 A | 4/2000 | Robinson et al. | | 6,246,118 B1 | 6/2001 | Buynoski |
| 6,054,398 A | 4/2000 | Pramanick | | 6,249,055 B1 | 6/2001 | Dubin |
| 6,057,226 A | 5/2000 | Wong | | 6,249,056 B1 | 6/2001 | Kwon et al. |
| 6,059,553 A | 5/2000 | Jin et al. | | 6,251,781 B1 | 6/2001 | Zhou et al. |
| 6,065,424 A | 5/2000 | Shacham-Diamand et al. | | 6,255,217 B1 | 7/2001 | Agnello et al. |
| 6,069,068 A | 5/2000 | Rathore et al. | | 6,258,707 B1 | 7/2001 | Uzoh |
| 6,071,810 A | 6/2000 | Wada et al. | | 6,261,946 B1 | 7/2001 | Iacoponi et al. |
| 6,075,278 A | 6/2000 | Farrar | | 6,262,376 B1 | 7/2001 | Hurwitz et al. |
| 6,075,287 A | 6/2000 | Ingraham et al. | | 6,265,311 B1 | 7/2001 | Hautala et al. |
| 6,077,792 A | 6/2000 | Farrar | | 6,265,811 B1 | 7/2001 | Takeuchi et al. |
| 6,090,697 A | 7/2000 | Xing et al. | | 6,268,276 B1 | 7/2001 | Chan et al. |
| 6,091,136 A | 7/2000 | Jiang et al. | | 6,268,277 B1 | 7/2001 | Bang |
| 6,091,475 A | 7/2000 | Ogino et al. | | 6,271,592 B1 | 8/2001 | Kim et al. |
| 6,100,193 A | 8/2000 | Suehiro et al. | | 6,280,640 B1 | 8/2001 | Hurwitz et al. |
| 6,107,186 A | 8/2000 | Erb | | 6,281,585 B1 | 8/2001 | Bothra |
| 6,117,781 A | 9/2000 | Lukanc et al. | | 6,284,656 B1 | 9/2001 | Farrar |
| 6,117,782 A | 9/2000 | Lukanc | | 6,287,954 B1 | 9/2001 | Ashley et al. |
| 6,121,126 A | 9/2000 | Ahn et al. | | 6,288,442 B1 | 9/2001 | Farrar |
| 6,121,149 A | 9/2000 | Lukanc et al. | | 6,288,447 B1 | 9/2001 | Amishiro et al. |
| 6,121,150 A | 9/2000 | Avanzino et al. | | 6,288,905 B1 | 9/2001 | Chung |
| 6,126,989 A | 10/2000 | Robinson et al. | | 6,303,498 B1 | 10/2001 | Chen et al. |
| 6,136,095 A | 10/2000 | Xu et al. | | 6,313,035 B1 | 11/2001 | Sandhu et al. |
| 6,139,699 A | 10/2000 | Chiang et al. | | 6,319,834 B1 | 11/2001 | Erb et al. |
| 6,140,228 A | 10/2000 | Shan et al. | | 6,323,543 B1 | 11/2001 | Jiang et al. |
| 6,140,234 A | 10/2000 | Uzoh et al. | | 6,323,553 B1 | 11/2001 | Hsu et al. |
| 6,140,456 A | 10/2000 | Lee et al. | | 6,326,303 B1 | 12/2001 | Robinson et al. |
| 6,143,604 A | 11/2000 | Chiang et al. | | 6,329,279 B1 | 12/2001 | Lee |
| 6,143,641 A | 11/2000 | Kitch | | 6,333,255 B1 | 12/2001 | Sekiguchi |
| 6,143,646 A | 11/2000 | Wetzel | | 6,342,448 B1 | 1/2002 | Lin et al. |
| 6,143,650 A | 11/2000 | Pramanick et al. | | 6,342,722 B1 | 1/2002 | Armacost et al. |
| 6,143,655 A | 11/2000 | Forbes et al. | | 6,350,687 B1 | 2/2002 | Avanzino et al. |
| 6,143,671 A | 11/2000 | Sugai | | 6,358,842 B1 | 3/2002 | Zhou et al. |
| 6,150,214 A | 11/2000 | Kaeriyama | | 6,359,328 B1 | 3/2002 | Dubin |

| | | |
|---|---|---|
| 6,361,667 B1 | 3/2002 | Kobayashi et al. |
| 6,365,511 B1 | 4/2002 | Kizilyalli et al. |
| 6,368,954 B1 | 4/2002 | Lopatin et al. |
| 6,368,965 B1 | 4/2002 | Lopatin |
| 6,372,622 B1 | 4/2002 | Tan et al. |
| 6,376,370 B1 | 4/2002 | Farrar |
| 6,383,920 B1 | 5/2002 | Wang et al. |
| 6,387,542 B1 | 5/2002 | Kozlov et al. |
| 6,399,489 B1 | 6/2002 | M'Saad et al. |
| 6,403,481 B1 | 6/2002 | Matsuda et al. |
| 6,410,418 B1 | 6/2002 | Yang |
| 6,410,442 B1 | 6/2002 | Yang |
| 6,413,827 B2 | 7/2002 | Farrar |
| 6,417,094 B1 | 7/2002 | Zhao et al. |
| 6,420,262 B1 | 7/2002 | Farrar |
| 6,420,702 B1 | 7/2002 | Tripsas et al. |
| 6,426,289 B1 | 7/2002 | Farrar |
| 6,429,120 B1 | 8/2002 | Ahn et al. |
| 6,448,331 B1 | 9/2002 | Ioka et al. |
| 6,492,266 B1 | 12/2002 | Ngo et al. |
| 6,495,445 B2 | 12/2002 | Clevenger et al. |
| 6,503,796 B1 | 1/2003 | Tu |
| 6,515,323 B1 | 2/2003 | Jung et al. |
| 6,518,173 B1 | 2/2003 | Chan |
| 6,518,198 B1 | 2/2003 | Klein |
| 6,562,416 B2 | 5/2003 | Ngo et al. |
| 6,563,219 B2 | 5/2003 | Ireland et al. |
| 6,573,182 B2 | 6/2003 | Sandhu et al. |
| 6,576,982 B1 | 6/2003 | You et al. |
| 6,589,863 B1 | 7/2003 | Usami |
| 6,633,074 B2 | 10/2003 | Ahn |
| 6,646,347 B2 | 11/2003 | Mercado et al. |
| 6,674,167 B1 | 1/2004 | Ahn et al. |
| 6,674,169 B2 | 1/2004 | Sandhu et al. |
| 6,709,919 B2 | 3/2004 | Tu |
| 6,710,447 B1 | 3/2004 | Nogami |
| 6,737,725 B2 | 5/2004 | Grill et al. |
| 6,740,392 B1 | 5/2004 | Farrar |
| 6,803,309 B2 | 10/2004 | Chou et al. |
| 6,833,289 B2 | 12/2004 | Hu et al. |
| 6,846,756 B2 | 1/2005 | Pan et al. |
| 6,849,927 B2 | 2/2005 | Farrar |
| 6,888,246 B2 | 5/2005 | Mercado et al. |
| 6,943,090 B2 | 9/2005 | Farrar |
| 6,984,891 B2 | 1/2006 | Ahn et al. |
| 7,067,421 B2 | 6/2006 | Ahn et al. |
| 7,105,914 B2 | 9/2006 | Farrar |
| 7,211,512 B1 | 5/2007 | Ahn et al. |
| 7,253,521 B2 | 8/2007 | Ahn et al. |
| 7,262,130 B2 | 8/2007 | Ahn et al. |
| 7,262,505 B2 | 8/2007 | Ahn et al. |
| 7,285,196 B2 | 10/2007 | Ahn et al. |
| 7,301,190 B2 | 11/2007 | Farrar |
| 2001/0002333 A1 | 5/2001 | Huang et al. |
| 2001/0054771 A1 | 12/2001 | Wark et al. |
| 2002/0014646 A1 | 2/2002 | Tsu et al. |
| 2002/0028552 A1 | 3/2002 | Lee et al. |
| 2002/0096768 A1 | 7/2002 | Joshi |
| 2002/0109233 A1 | 8/2002 | Farrar |
| 2002/0115292 A1 | 8/2002 | Andricacos et al. |
| 2002/0167089 A1 | 11/2002 | Ahn et al. |
| 2002/0177302 A1 | 11/2002 | Farrar |
| 2002/0182859 A1 | 12/2002 | Farrar |
| 2003/0034560 A1 | 2/2003 | Matsuse et al. |
| 2004/0161924 A1 | 8/2004 | Chen et al. |
| 2005/0023697 A1 | 2/2005 | Ahn et al. |
| 2005/0023699 A1 | 2/2005 | Ahn et al. |
| 2005/0032352 A1 | 2/2005 | Farrar |
| 2005/0112871 A1 | 5/2005 | Ahn et al. |
| 2005/0285272 A1 | 12/2005 | Farrar |
| 2006/0006548 A1 | 1/2006 | Farrar |
| 2006/0292857 A1 | 12/2006 | Ahn et al. |
| 2007/0085213 A1 | 4/2007 | Ahn et al. |
| 2007/0141830 A1 | 6/2007 | Ahn et al. |
| 2007/0167005 A1 | 7/2007 | Ahn et al. |

FOREIGN PATENT DOCUMENTS

| | | |
|---|---|---|
| JP | 5-267643 | 10/1993 |
| JP | 05160826 | 3/1995 |
| JP | 7078815 | 3/1995 |
| JP | 07078815 | 3/1995 |
| JP | 07-321111 | 8/1995 |

OTHER PUBLICATIONS

Fleming, J. G., et al., "Use Of Air Gap Structures To Lower Level Intralevel Capacitance", *Proceedings of the 1997 Dielectrics for ULSI Multi-level Interconnect Conference*, (1997),140.

Shieh, B., et al., "Air-Gap Formation During IMD Deposition to Lower Interconnect Capacitance", *IEEE Electron Device Letters*, 19(1), (1998),16-18.

Ueda, T., et al., "A novel Air Gap Integration Scheme for Multi-level Interconnects using Self-aligned Via Plugs", *Symposium on VLSI Technology Digest of Technical Papers*, (1998),46-47.

"Brooks Model 5964 High Performance Metal Seal Mass Flow Controller (Introduced in 1991)", *Brooks Instrument*, http://www.frco.com/brooks/semiconductor/products1i.html,(1991),1 page.

"Improved Metallurgy for Wiring Very Large Scale Integrated Circuits", *International Technology Disclosures*, 4, Abstract,(1986),1 page.

Abe, K., et al., "Sub-half Micron Copper Interconnects Using Reflow of Sputtered Copper Films", *VLSI Multilevel Interconnection Conference*, (Jun. 25-27, 1995),308-311.

American Society for Metals, "Metals Handbook", *Properties and Selection: Nonferrous Alloys and Pure Metals*, Ninth Edition, vol. 2, Metals Park, Ohio : American Society for Metals,(1989),157, 395.

Andricacos, P. C., "Copper On-Chip Interconnections", *the Electrochemical Society Interface*, (1999),32-37.

Anonymous, "Formation of Conductors at Variable Depths—Using Differential Photomask, Projecting Images into Insulator by Reactive Ion Etching, Selectively Filling Images with Conductor", *Research Disclosure*, Disclosure No. RD 291015, Abstract,(Jul. 10, 1988), 1 page.

Bae, Sanghoon, et al., "Low-Temperature Deposition Pathways to Silicon Nitride, Amorphous Silicon, Polycrystalline Silicon, and n type Amorphous Silicon Films Using a High Density Plasma System", *IEEE Conference Records—Abstracts, International Conference on Plasma Science*, (1997),315.

Bai, G., "Copper Interconnection Deposition Techniques and Integration", *1996 Symposium on VLSI Technology*, Digest of Technical Papers,(1996),48-49.

Bernier, M., et al., "Laser processing of palladium for selective electroless copper plating", *SPIE*, 2045, (1994),330-337.

Bhansali, S., et al., "A novel technique for fabrication of metallic structures on polymide by selective electroless copper plating using ion implantation", *Thin Solid Films*, 270, No. 1/02, (1995),489-492.

Bhansali, S., et al., "Selective electroless copper plating on silicon seeded by copper ion implantation", *Thin Solid Films*, 253, (1994),391-394.

Braud, F., "Ultra Thin Diffusion Barriers for Cu Interconnections at The Gigabit Generation and Beyond", *VMIC Conference Proceedings*, (1996),174-179.

Cabrera, A. L., et al., "Oxidation protection for a variety of transition metals and copper via surface silicides formed with silane containing atmospheres", *Journal of Materials Research*, 6(1), (1991),71-79.

Craig, J. D., "Polymide Coatings", *Packaging, Electronic Materials Handbook*, vol. 1, ASM International Handbook Committee (eds.), ASM International, Materials Park, OH,(1989),767-772.

De Felipe, T. S., et al., "Electrical Stability and Microstructural Evolution in Thin Films of High Conductivity Copper Alloys", *Interconnect Technology, 1999, IEEE International Conference*, (May 24-26, 1999),293-295.

Ding, "Copper Barrier, Seed Layer and Planarization Technologies", *VMIC Conference Proceedings*, (1997),87-92.

Dubin, V. M., et al., "Selective and Blanket Electroless Copper Deposition for Ultralarge Scale Integration", *Journal of the Electrochemical Society*, 144(3), (1997),898-908.

Dushman, S., et al., *Scientific Foundations of Vacuum Technique*, 2nd Edition, John Wiley and Sons,(1962),1-806.

Edelstein, D., "Full Copper Wiring in a Sub-0.25 micrometer CMOS ULSI Technology", *Technical Digest, International Electron Devices Meeting*, (Dec. 7-10, 1997),773-776.

Eisenbraun, E. T., et al., "Selective and Blanket Low-Temperature Copper CVD for Multilevel Metallization in ULSI", *Conference Proceedings ULSI-VII*, (1992),5 pages.

Eldridge, J. M., "New Approaches for Investigating Corrosion in Thin Film Devices", *Electronic Packaging and Corrosion in Microelectronics, PRoceedings of ASM's Third Conference on Electric Packaging: Materials and Processes & Corrosion in Microelectronics*, Mpls, MN,(1987),283-285.

Ernst, et al., "Growth Model for Metal Films on Oxide Surface: Cu on ZnO(0001)-O", *Physical Review B*, 47, (May 15, 1993),13782-13796.

Fukuda, T., et al., "0.5 -micrometer-Pitch Copper-Dual-Damascene Metallization Using Organic SOG (k=2.9) for 0.18-micrometer CMOS Applications", *Electron Devices Meeting, 1999. IEDM Technical Digest, International*, (1999),619-622.

Gladlfelter, W. L., et al., "Trimethylamine Complexes of Alane as Precursors for the Low-Pressure Chemical Vapor Deposition of Aluminum", *Chemistry of Materials*, 1, (1989),pp. 339-343.

Godbey, D. J., et al., "Copper Diffusion in Organic Polymer Resists and Inter-level Dielectrics", *Thin Solid Films*, 308-309, (1997),pp. 470-474.

Grimblot, J., et al., "II. Oxidation of Aluminum Films", *Journal of the Electrochemical Society*, 129(10), (1982),2369-2372.

Hattangady, S. V., et al., "Integrated processing of silicon oxynitride films by combined plasma and rapid-thermal processing", *J. Vac. Sci. Technol. A*, 14(6), (1996),pp. 3017-3023.

Hirao, S., et al., "A Novel Copper Reflow Process Using Dual Wetting Layers", *Symposium on VLSI Technology, Digest of Technical Papers*,(1997),57-58.

Hirata, A., et al., "WSiN Diffusion Barrier Formed by ECR Plasma Nitridation for Copper Damascene Interconnection", *16th Solid State Devices and Materials*, (1998),pp. 260-261.

Holloway, Karen, et al., "Tantalum as a diffusion barrier between copper and silicon", *Applied Physics Letters*, 57(17), (Oct. 1990),1736-1738.

Hu, C. K., et al., "Extendibility of Cu Damascene to 0.1 micrometer Wide Interconnections", *Mat. Res. Soc. Symp. Proc*, 514, (1998),pp. 287-292.

Hymes, S., et al., "Passivation of Copper by Silicide Formation in Dilute Silane", *Conference Proceedings ULSI-VII*, (1992),425-431.

Iijima, T., "Microstructure and Electrical Properties of Amorphous W-Si-N Barrier Layer for Cu Interconnections", *1996 VMIC Conference*, (1996),168-173.

Izaki, M., et al., "Characterization of Transparent Zinc Oxide Films Prepared by Electrochemical Reaction", *Journal of the Electrochemical Society*, 144, (Jun. 1997),1949-1952.

Jayaraj, K., "Low Dielectric Constant Microcellular Foams", *Proceedings from the Seventh Meeting of the DuPont Symposium on Polymides in Microelectrics*, (Sep. 1996),474-501.

Jeon, Y., et al., "Low-Temperature Fabrication of Polycrystalline Silicon Thin Films by ECR Pecvd", *The Electrochemical Society Proceedings*, 94(35), (1995),103-114.

Jin, C., et al., "Porous Xerogel Films as Ultra-low Permittivity Dielectrics for ULSI Interconnect Applications", *Conference Proceedings ULSI XII—1997 Materials Research Society*, (1997),463-469.

Kaloyeros, A. E., et al., "Blanket and Selective Copper CVD from Cu(FOD)2 for Multilivel Metallization", *Mat. Res. Soc. Symp. Proc.*, vol. 181,(1990),6 pages.

Kamins, T. I., "Structure and Properties of LPCVD Silicon Films", *J. Electrochem. Soc.: Solid-State Science and Technology*, 127, (Mar. 1980),pp. 686-690.

Kang, H. K., et al., "Grain Structure and Electromigration Properties of CVD CU Metallization", *Proceedings of the 10th International VLSI Multilevel Interconnection Conference*, (Jun. 8-9, 1993),223-229.

Keppner, H., et al., "The "Micromorph" Cell: A New Way to High-Efficiency-Low-Temperature Crystalline Silicon Thin-Film Cell Manufacturing", *Mat. Res. Soc. Symp. Proc.*, 452, (1997),pp. 865-876.

Kiang, M., et al., "Pd/Si plasma immersion ion implantation for selective electroless copper plating on Si02", *Applied Physics Letters*, 60(22), (Jun. 1, 1992),2767-2769.

Kirk, Raymond E., *Kirk-Othmer Concise Encyclopedia of Chemical Technology*, Grayson, M., (ed.), John Wiley & Sons, Inc., New York, NY,(1985),433-435, 926-938.

Kistiakowsky, G. B., et al., "Reactions of Nitrogen Atoms. I. Oxygen and Oxides of Nitrogen", *The Journal of Chemical Physics*, 27(5), (1957),pp. 1141-1149.

Klaus, J W., "Atomic Layer Deposition of Tungsten Nitride Films Using Sequential Surface Reactions", *Journal of the Electrochemical Society*, vol. 147, No. 3, (Mar. 2000),1175-1181.

Laursen, T., "Encapsulation of Copper by Nitridation of Cu-Ti Alloy/Bilayer Structures", *International Conference on Metallurgical Coatings and Thin Films*, Abstract No. H1.03, San Diego, CA,(Apr. 1997),309.

Len, V., et al., "An investigation into the performance of diffusion barrier materials against copper diffusion using metal-oxide-semiconductor (MOS) capacitor structures", *Solid-State Electronics*, 43, (1999),pp. 1045-1049.

Lyman, T., et al., "Metallography, Structures and Phase Diagrams", *Metals Handbook*, 8, American Society for Metals, Metals Park, Ohio,(1989),pp. 300 & 302.

Marcadal, C., "OMCVD Copper Process for Dual Damascene Metallization", *VMIC Conference*, ISMIC,(1997),93-97.

Miller, R. D., "Low Dielectric Constant Polyimides and Polyimide Nanofoams", *Seventh Meeting of the DuPont Symposium on Polymides in Microelectronics*, (Sep. 1996),443-473.

Min, Jae-Sik, et al., "Metal-Organic Atomic-Layer Deposition of Titanium-Silicon-Nitride Films", *Applied Physics Letters*, 75(11), (Sep. 13, 1999),1521-1523.

Miyake, T., et al., "Atomic Hydrogen Enhanced Reflow of Copper", *Applied Physics Letters*, 70(10), (1997),1239-1241.

Murarka, S. P., et al., "Copper Interconnection Schemes: Elimination of The Need of Diffusion Barrier/Adhesion Promoter by the Use of Corrosion Resistant, Low Resistivity Doped Copper", *SPIE*, 2335, (1994),pp. 80-90.

Murarka, S. P., et al., "Copper Metallization for ULSI and Beyond", *Critical Reviews in Solid State and Materials Sciences*, 20(2), (1995),87-124.

Nakao, S., et al., "Thin and Low-Resistivity Tantalum Nitride Diffusion Barrier and Giant-Grain Copper Interconnects for Advanced ULSI Metallization", *Japanese Journal of Applied Physics*, 38(4B), (Apr. 1999),pp. 262-263.

Newboe, B., et al., "Applied Materials Announces First Barrier/Seed Layer System For Copper Interconnects", *Applied Materials*, http://www.appliedmaterials.com/newsroom/pr-00103.html,(1997),pp. 1-4.

Okamoto, Y., et al., "Magnetically Excited Plasma Oxynitridation of Si at Room Temperature", *Japanese Journal of Applied Physics*, 34, (1995),L955-957.

Palleau, J., et al., "Refractory Metal Encapsulation in Copper Wiring", *Advanced Metallization for Devices and Circuits-Science, Technology and Manufacturability, Materials Research Society Symposium Proceedings*, 337, (Apr. 1994),225-231.

Park, C. W., et al., "Activation Energy for Electromigration in Cu Films", *Applied Physics Letters*, 59(2), (Jul. 6, 1991),175-177.

Radzimski, Z. J., et al., "Directional Copper Deposition using d-c Magnetron Self-sputtering", *J. Vac. Sci. Technol. B*, 16(3), (1998),pp. 1102-1106.

Ramos, T, et al., "Nanoporous Silica for Dielectric Constant Less Than 2", *Conference Proceedings ULSI XII—1997 Materials Research Society*, (1997),455-461.

Rath, J. K., et al., "Low-Temperature deposition of polycrystalline silicon thin films by hot-wire CVD", *Solar Energy Materials and Solar Cells*, 48, (1997),pp. 269-277.

Ray, S. K., et al., "Flourine-enhanced nitridation of silicon at low temperatures in a microwave plasma", *J. Appl. Phys.*, 70(3), (1991),pp. 1874-1876.

Rossnagel, S. M., "Magnetron Sputter Deposition of Interconnect Applications", *Conference Proceedings, ULSI XI*, (1996),227-232.

Rossnagel, S. M., et al., "Metal ion deposition from ionized mangetron sputtering discharge", *J. Vac. Sci. Technol. B*, 12(1), (1994),pp. 449-453.

Ryan, J. G., "Copper Interconnects for Advanced Logic and DRAM", Extended Abstracts of the 1998 International Conference on Solid-State Devices and Materials, Hiroshima,(1998),pp. 258-259.

Ryu, C. , et al., "Barriers for copper interconnections", *Solid State Technology*, (Apr. 1999),pp. 53,54,56.

Saarivirta, M. J., "High Conductivity Copper Rich Cu-Zr Alloys", *Transactions of the Metallurgical Society of AIME*, 218, (1960),431-437.

Senzaki, Y. , "Chemical Vapor Deposition of Copper using a New Liquid Precursor with Improved Thermal Stability", *Conference Proceedings ULSI XIII, Materials Research Society*, (1998),pp. 451-455.

Shacham-Diamand, Y. , "100 nm Wide Copper Lines Made by Selective Electroless Deposition", *Journal of Micromechanics and Microengineering*, 1, (Mar. 1991),66-72.

Shacham-Diamand, Yosi , et al., "Copper electroless deposition technology for ultra-large-scale-intergration (ULSI) metallization", *Microelectronic Engineering*, NL, vol. 33, No. 1, XP004054497, (1997),47-58.

Srivatsa, A. R., et al., "Jet Vapor Deposition: an Alternative to Electrodeposition", *Surface Engineering*, 11, (1995),75-77.

Stroud, P. T., et al., "Preferential deposition of silver induced by low energy gold ion implantation", *Thin Solid Films*, Switzerland, vol. 9, No. 2, XP000993098, (Feb. 1972),273-281.

Tao, J. , et al., "Electromigration Characteristics of Copper Interconnects", *IEEE Electron Devices Letters*, 14(5), (May 1993),249-251.

Ting, C. H., "Methods and Needs for Low K Material Research", *Materials Research Society Symposium Proceedings*, vol. 381, Low-Dielectric Constant Materials—Synthesis and Applications in Microelectronics, Lu, T.M., et al., (eds.), San Francisco, CA,(Apr. 17-19, 1995),3-17.

Tsukada, T. , et al., "Adhesion of copper films on ABS polymers deposited in an Internal magnet magnetron sputtering system", *J. Vac. Sci. Technol.*, 16(2), (1979),348-351.

Van Vlack, Lawrence H., "Elements of Materials Science", Addison-Wesley Publishing Co., Inc. Reading, MA, (1959),468.

Venkatesan, S. , et al., "A High Performance 1.8V, 0.20 micrometer CMOS Technology with Copper Metalization", *Electron Devices Meeting, 1997, Technical Digest International*, (Dec. 7-10, 1997),769-772.

Vossen, J. L., et al., *Thin Film Processes II*, Academic Press, Inc. ,(1991),1-866.

Wang, X. W., et al.,"Highly Reliable Silicon Nitride Thin Films Made by Jet Vapor Deposition", *Japanese Journal of Applied Physics*, vol. 34, Part 1. No. 2B, (Feb. 1995),955-958.

Wang, K. , et al., "Very Low Temperature Deposition of Polycrystalline Silicon Films with Micro-Meter-Order Grains on SiO2", *Mat. Res. Soc. Symp. Proc.*, 355, (1995),pp. 581-586.

Winters, H. F., et al., "Influence of Surface Absorption Characteristics on Reactivity Sputtered Films Grown in the Biased and Unbiased Modes", *J. Appl. Phys.*, 43(3), (1972),pp. 794-799.

Wolf, S. , et al., *Silicon Processing for the VLSI Era, vol. 1—Process Technology*, Lattice Press, Sunset Beach, CA,(1986),514-538.

Wolf, S. , "Chapter 4: Multilevel-Interconnect Technology for VLSI and ULSI", *Silicon Processing for the VLSI Era, vol. 2 Process Integration*, Lattice Press, Sunset Beach, CA,(1990),176-297.

Yeh, J. L., et al., "Selective Copper plating of Polysilicon Surface Micromachined Structures", *Solid-State Sensor and Actuator Workshop*, (1998),pp. 248-251.

Zhang, J. , et al., "Investigations of photo-induced decomposition of palladium acetate for electroless copper plating", *Thin Solid Films*, 318, (1998),pp. 234-238.

U.S. Appl. No. 60/114,039, filed Dec. 29, 1998, Havemann, H. R., et al.

American Society for Metals, "Phase Diagrams", *Metals Handbook*, 10th Ed., vol. 3, Metals Park, Ohio,(1992).

Chakravorty, K. K., et al., "High-Density Interconnection Using Photosensitive Polyimide and Electroplated Copper Conductor Lines", *IEEE Transactions on Components, Hybrids, and Manufacturing Technology*, 13(1), (Mar. 1990),200-206.

Chang, J. Y. C. , et al., "Large Suspended Inductors on Silicon and their use in a 2-um CMOS RF Amplifier", *IEEE Electron Device Letters*, 14(5), (May 1993),246-248.

Dudzinski, N. , et al., "The Youngs Modulus of Some Aluminim Alloys", *J. Institute of Metals*, vol. LXXIV, (1947-1948),291-314.

Fleming, J. G., et al., "Use Of Air Gap Structures To Lower Level Intralevel Capacitance", *Proceedings of the 1997 Dielectrics for ULSI Multi-level Interconnect Conference*, (1997),140.

Grill, A. , et al., "Low dielectric constant films prepared by plasma-enhanced chemical vapor deposition from tetramethvisilane", *Journal of Applied Physics*, 85(6), (1999),3314-3318.

Nayak, D. K., "High performance GeSi quantum-well PMOS on SIMOX", *International Electron Devices Meeting 1992. Technical Digest*, (1992),777-780.

Quan, Y. C., et al., "Polymer-like Organic Thin Films Deposited by Plasma Enhanced Chemical Vapor Deposition Using the Para-xylene Precursor as Low Dielectric Constant Interlayer Dielectrics for Multilevel Metallization", *Japanese Journal of Applied Physics*, vol. 38, Part1, No. 3A, (1999),1356-1358.

Ryu, Changsup , "Barriers for Copper Interconnections", *Solid State Technology*, 42(4), (Apr. 1999),pp. 1-3.

Shacham-Diamand, Y. , "100 nm Wide Copper Lines Made by Selective Electroless Deposition", *Journal of Micromechanics and Microengineering*, 1, (Mar. 1991),66-72.

Shieh, B. , et al., "Air-Gap Formation During IMD Deposition to Lower Interconnect Capacitance", *IEEE Electron Device Letters*, 19(1), (1998), 16-18.

Singer, Ferdinand L., "Strength of Materials", *Harper & Brothers*, New York, (1951),229-32.

Uchida, Y. , et al., "A Fluorinated Organic-Silica Film with Extremely Low Dielectric Constant", *Japanese Journal of Applied Physics*, vol. 38 Part1 No. 4B, (Apr. 1999),2368-2372.

Ueda, T. , et al., "A novel Air Gap Integration Scheme for Multi-level Interconnects using Self-aligned Via Plugs", *Symposium on VLSI Technology Digest of Technical Papers*, (1998),46-47.

Van Horn, K. R., "Aluminum vol. III Fabrication and Finishing", *American Society for Metals*, Metals Park, OH,(1967),468.

U.S. Appl. No. 11/458,975, Notice of Allowance Mailed Oct. 23, 2007, 7 Pages.

U.S. Appl. No. 09/032,197 Amendment and response filed Mar. 16, 2000 to Non Final Office Action mailed Dec. 16, 1999, 1 pg.

U.S. Appl. No. 09/032,197 Non Final Office Action mailed Apr. 18, 2000, 6 pgs.

U.S. Appl. No. 09/032,197 Notice of Allowance mailed Oct. 3, 2000, 6 pgs.

U.S. Appl. No. 09/488,098 Non Final Office Action mailed Mar. 19, 2001, 14 pgs.

U.S. Appl. No. 09/488,098 Non Final Office Action mailed Aug. 20, 2001, 7 pgs.

U.S. Appl. No. 09/488,098 Notice of Allowance mailed Feb. 28, 2002, 6 pgs.

U.S. Appl. No. 09/854,540 Amendment and response filed Feb. 27, 2003 to Non Final Office Action mailed Nov. 27, 2002, 10 pgs.

U.S. Appl. No. 09/854,540 Amendment and response filed Jun. 23, 2003 to Final Office Action mailed Apr. 22, 2003, 15 pgs.

U.S. Appl. No. 09/854,540 Final Office Action mailed Apr. 22, 2003. pdf, 14 pgs.

U.S. Appl. No. 09/854,540 Non Final Office Action mailed Nov. 27, 2002, 19 pgs.

U.S. Appl. No. 09/854,540 Notice of Allowance mailed Feb. 10, 2004, 5 pgs.

U.S. Appl. No. 09/854,540 Notice of Allowance mailed Aug. 12, 2003, 10 pgs.

U.S. Appl. No. 09/032,197 Amendment and response filed Jul. 18, 2000 to Non Final Office Action mailed Apr. 18, 2000, 5 pgs.

U.S. Appl. No. 09/032,197 Non Final Office Action mailed Dec. 16, 1999, 7 pgs.
U.S. Appl. No. 09/128,859 Amendment Under 37 CFR 1.312 filed Jun. 13, 2001, 2 pgs.
U.S. Appl. No. 09/128,859 Non final Office Action mailed Jul. 19, 2000, 5 pgs.
U.S. Appl. No. 09/128,859 Notice of Allowance mailed Mar. 13, 2001, 4 pgs.
U.S. Appl. No. 09/128,859 Response filed Dec. 19, 2000 to Non final Office Action mailed Jul. 19, 2000, 7 pgs.
U.S. Appl. No. 09/817,447 Final Office Action mailed May 6, 2002, 7 pgs.
U.S. Appl. No. 09/817,447 Non final Office Action mailed Oct. 23, 2001, 5 pgs.
U.S. Appl. No. 09/817,447 Notice of Allowance mailed Jan. 27, 2005, 9 pgs.
U.S. Appl. No. 09/817,447 Response filed Jul. 8, 2002 to Final Office Action mailed May 6, 2002, 5 pgs.
U.S. Appl. No. 09/817,447 Response filed Jan. 23, 2002 to Non final Office Action mailed Oct. 23, 2001, 10 pgs.
U.S. Appl. No. 09/946,055 Non Final Office Action mailed Feb. 26, 2002, 7 pgs.
U.S. Appl. No. 09/946,055 Notice of Allowance mailed Mar. 21, 2003, 8 pgs.
U.S. Appl. No. 09/946,055 Notice of Allowance mailed Jul. 15, 2002, 7 pgs.
U.S. Appl. No. 09/946,055 Notice of Allowance mailed Nov. 13, 2002, 10 pgs.
U.S. Appl. No. 09/946,055 Response filed May 28, 2002 to Non Final Office Action mailed Feb. 26, 2002, 7 pgs.
U.S. Appl. No. 10/117,041 Non Final Office Action mailed Jun. 6, 2003, 16 pgs.
U.S. Appl. No. 10/117,041 Non Final Office Action mailed Oct. 17, 2005, 15 pgs.
U.S. Appl. No. 10/117,041 Non Final Office Action mailed Dec. 16, 2002, 11 pgs.
U.S. Appl. No. 10/117,041 Notice of Allowance mailed Jan. 26, 2005, 6 pgs.
U.S. Appl. No. 10/117,041 Notice of Allowance mailed Apr. 7, 2006, 6 pgs.
U.S. Appl. No. 10/117,041 Notice of Allowance mailed Jun. 1, 2004, 6 pgs.
U.S. Appl. No. 10/117,041 Notice of Allowance mailed Dec. 11, 2003, 8 pgs.
U.S. Appl. No. 10/117,041 Response filed Jan. 17, 2006 to Non Final Office Action mailed Oct. 17, 2005, 14 pgs.
U.S. Appl. No. 10/117,041 Response filed Mar. 17, 2003 to Non Final Office Action mailed Dec. 16, 2002, 16 pgs.
U.S. Appl. No. 10/117,041 Response filed Sep. 8, 2003 to Non Final Office Action mailed Jun. 6, 2003, 22 pgs.
U.S. Appl. No. 10/196,078 Notice of Allowance mailed Jan. 31, 2003, 8 pgs.
U.S. Appl. No. 10/196,078 Notice of Allowance mailed Jun. 6, 2003, 15 pgs.
U.S. Appl. No. 10/196,078 Notice of Allowance mailed Nov. 28, 200, 6 pgs.
U.S. Appl. No. 10/211,855 Notice of Allowance mailed Jan. 13, 2003, 14 pgs.
U.S. Appl. No. 10/211,855 Notice of Allowance mailed Jan. 20, 2004, 5 pgs.
U.S. Appl. No. 10/211,855 Notice of Allowance mailed May 28, 2003, 11 pgs.
U.S. Appl. No. 10/929,251 Amendment Under 37 CFR 1.312 filed May 31, 2007, 10 pgs.
U.S. Appl. No. 10/929,251 Final Office Action mailed May 5, 2006, 29 pgs.
U.S. Appl. No. 10/929,251 Non final Office Action mailed Nov. 1, 2005, 38 pgs.
U.S. Appl. No. 10/929,251 Notice of Allowance mailed Mar. 1, 2007, 11 pgs.
U.S. Appl. No. 10/929,251 Notice of Allowance mailed Sep. 7, 2006, 10 pgs.
U.S. Appl. No. 10/929,251 Response filed Feb. 1, 2006 to Non final Office Action mailed Nov. 1, 2005, 19 pgs.
U.S. Appl. No. 10/929,251 Response filed Jul. 5, 2006 to Final Office Action mailed May 5, 2006, 19 pgs.
U.S. Appl. No. 10/789,882 Non Final Office Action mailed Feb. 7, 2007, 34 pgs.
U.S. Appl. No. 10/789,882 Non Final Office Action mailed Sep. 7, 2004, 28 pgs.
U.S. App. No. 10/789,882 Non Final Office Action mailed Sep. 12, 2006, 18 pgs.
U.S. Appl. No. 10/789,882 Notice of Allowance mailed Feb. 10, 2006, 8 pgs.
U.S. Appl. No. 10/789,882 Notice of Allowance mailed Mar. 7, 2005, 7 pgs.
U.S. Appl. No. 10/789,882 Notice of Allowance mailed Jul. 8, 2005, 7 pgs.
U.S. Appl. No. 10/789,882 Response filed May 2, 2007 to Non Final Office Action mailed Feb. 7, 2007, 23 pgs.
U.S. Appl. No. 10/789,882 Resposne filed Dec. 7, 2004 to Non Final Office Action mailed Sep. 7, 2004, 20 pgs.
U.S. Appl. No. 10/789,882 Response filed Dec. 12, 2006 to Non Final Office Action mailed Sep. 12, 2006, 20 pgs.
U.S. Appl. No. 09/483,869 Non final Office Action mailed Jul. 6, 2001, 21 pgs.
U.S. Appl. No. 09/483,869 Notice of Allowance mailed Jan. 15, 2002, 7 pgs.
U.S. Appl. No. 09/483,881 Amendment under 37 CFR 1.312 filed Feb. 8, 2007, 11 pgs.
U.S. Appl. No. 09/483,881 Final Office Action mailed Feb. 14, 2005, 10 pgs.
U.S. Appl. No. 09/483,881 Final Office Action mailed Jun. 9, 2004, 15 pgs.
U.S. Appl. No. 09/483,881 Final Office Action mailed Nov. 26, 2002, 11 pgs.
U.S. Appl. No. 09/483,881 Non Final Office Action mailed Jun. 14, 2002, 17 pgs.
U.S. Appl. No. 09/483,881 Non Final Office Action mailed Jun. 30, 2003, 13 pgs.
U.S. Appl. No. 09/483,881 Non Final Office Action mailed Jul. 27, 2005, 5 pgs.
U.S. Appl. No. 09/483,881 Non Final Office Action mailed Oct. 19, 2004, 10 pgs.
U.S. Appl. No. 09/483,881 Non Final Office Action mailed Dec. 23, 2003, 9 pgs.
U.S. Appl. No. 09/483,881 Notice of Allowance mailed Jan. 12, 2006, 9 pgs.
U.S. Appl. No. 09/483,881 Notice of Allowance mailed Feb. 19, 2003, 8 pgs.
U.S. Appl. No. 09/483,881 Notice of Allowance mailed May 11, 2006, 5 pgs.
U.S. Appl. No. 09/483,881 Notice of Allowance mailed Nov. 8, 2006, 7 pgs.
U.S. Appl. No. 09/483,881 Response filed Jan. 27, 2003 to Final Office Action mailed Nov. 26, 2002, 6 pgs.
U.S. Appl. No. 09/483,881 Response filed Apr. 22, 2004 to Non-final Office Action mailed Dec. 23, 2003, 13 pgs.
U.S. Appl. No. 09/483,881 Response filed Jul. 23, 2004 to Final Office Action mailed Jun. 9, 2004, 15 pgs.
U.S. Appl. No. 09/483,881 Response filed Sep. 16, 2002 to Non-final Office Action mailed Jun. 14, 2002, 12 pgs.
U.S. Appl. No. 09/483,881 Response filed Oct. 24, 2003 to Non-final Office Action mailed Jun. 30, 2003, 9 pgs.
U.S. Appl. No. 09/483,881 Response filed Oct. 27, 2005 to Non-final Office Action mailed Jul. 27, 2005, 14 pgs.
U.S. Appl. No. 09/483,881 Response filed Dec. 22, 2004 to Non-final Office Action mailed Oct. 19, 2004, 16 pgs.
U.S. Appl. No. 09/484,303 Amendment under 37 CFR 1.312 filed Jan. 23, 2007, 3 pgs.
U.S. Appl. No. 09/484,303 Final Office Action mailed Jun. 10, 2004, 11 pgs.
U.S. Appl. No. 09/484,303 Non Final Office Action mailed Mar. 31, 2003, 22 pgs.

U.S. Appl. No. 09/484,303 Non Final Office Action mailed Oct. 18, 2005, 8 pgs.
U.S. Appl. No. 09/484,303 Non Final Office Action mailed Nov. 12-2003, 11 pgs.
U.S. Appl. No. 09/484,303 Notice of Allowance mailed Mar. 10, 2006, 7 pgs.
U.S. Appl. No. 09/484,303 Notice of Allowance mailed Mar. 23, 2007, 7 pgs.
U.S. Appl. No. 09/484,303 Notice of Allowance mailed May 4, 2005, 9 pgs.
U.S. Appl. No. 09/484,303 Notice of Allowance mailed Oct. 24, 2006, 8 pgs.
U.S. Appl. No. 09/484,303 Response filed Jan. 17, 2006 to Non Final Office Action mailed Oct. 18, 2005, 7 pgs.
U.S. Appl. No. 09/484,303 Response filed Feb. 12, 2004 to Non Final Office Action mailed Nov. 12, 2003, 15 pgs.
U.S. Appl. No. 09/484,303 Response filed Jul. 30, 2003 to Non Final Office Action mailed Jun. 10, 2004, 2 pgs.
U.S. Appl. No. 09/484,303 Response filed Sep. 10, 2004 to Final Office Action mailed Jun. 10, 2004, 15 pgs.
U.S. Appl. No. 09/484,002 Final Office Action mailed Sep. 26, 2001, 7 pgs.
U.S. Appl. No. 09/484,002 Non Final Office Action mailed Apr. 11, 2001, 13 pgs.
U.S. Appl. No. 09/484,002 Notice of Allowance mailed Dec. 18, 2001, 7 pgs.
U.S. Appl. No. 09/484,002 Response filed Dec. 4, 2001 to Final Office Action mailed Sep. 26, 2001, 4 pgs.
U.S. Appl. No. 09/484,002 Response filed Dec. 4, 2001 to Non Final Office Action mailed Apr. 11, 2001, 4 pgs.
U.S. Appl. No. 09/584,157 Final Office Action mailed May 8, 2003, 6 pgs.
U.S. Appl. No. 09/584,157 Non Final Office Action mailed Apr. 8, 2002, 20 pgs.
U.S. Appl. No. 09/584,157 Non Final Office Action mailed Oct. 3, 2002, 18 pgs.
U.S. Appl. No. 09/584,157 Notice of Allowance mailed Jul. 30, 2003, 6 pgs.
U.S. Appl. No. 09/584,157 Response filed Feb. 3, 2003 to Non Final Office Action mailed Oct. 3, 2002.pdf, 27 pgs.
U.S. Appl. No. 09/584,157 Response filed Jul. 8, 2002 to Non Final Office Action mailed Apr. 8, 2002, 11 pgs.
U.S. Appl. No. 09/584,157 Response filed Jul. 8, 2003 to Final Office Action mailed May 8, 2003, 15 pgs.
U.S. Appl. No. 10/195,965 Amendment and response under 37 CFR 1.116 filed Jan. 4, 2007, 22 pgs.
U.S. Appl. No. 10/195,965 Final Office Action mailed Oct. 4, 2006, 9 pgs.
U.S. Appl. No. 10/195,965 Non Final Office Action mailed Jan. 24, 2003, 6 pgs.
U.S. Appl. No. 10/195,965 Non Final Office Action mailed Jun. 12, 2006, 13 pgs.
U.S. Appl. No. 10/195,965 Notice of Allowance mailed Mar. 3, 2004, 6 pgs.
U.S. Appl. No. 10/195,965 Notice of Allowance mailed Jun. 15, 2007, 9 pgs.
U.S. Appl. No. 10/195,965 Notice of Allowance mailed Jul. 23, 2003, 17 pgs.
U.S. Appl. No. 10/195,965 Notice of Allowance mailed Aug. 31, 2004, 11 pgs.
U.S. Appl. No. 10/195,965 Notice of Allowance mailed Dec. 20, 2004, 9 pgs.
U.S. Appl. No. 10/195,965 Response filed Jan. 4, 2007 to Final Office Action mailed Oct. 4, 2006, 22 pgs.
U.S. Appl. No. 10/195,965 Response filed Apr. 24, 2003 to Non-final Office Action mailed Jan. 24, 2003, 26 pgs.
U.S. Appl. No. 10/195,965 Response filed Aug. 24, 2006 to Non-final Office Action mailed Jun. 12, 2006, 25 pgs.
U.S. Appl. No. 10/196,081 Amendment Under 37 CFR 1.116 filed Mar. 26, 2007, 11 pgs.
U.S. Appl. No. 10/196,081 Final Office Action mailed Oct. 4, 2006, 10 pgs.
U.S. Appl. No. 10/196,081 Non Final Office Action mailed Jan. 23, 2003, 6 pgs.
U.S. Appl. No. 10/196,081 Non Final Office Action mailed Jan. 25, 2005, 13 pgs.
U.S. Appl. No. 10/196,081 Non Final Office Action mailed Jun. 12, 2006, 12 pgs.
U.S. Appl. No. 10/196,081 Non Final Office Action mailed Aug. 25, 2004, 11 pgs.
U.S. Appl. No. 10/196,081 Notice of Allowance mailed Feb. 12, 2004, 4 pgs.
U.S. Appl. No. 10/196,081 Notice of Allowance mailed May 15, 2007, 9 pgs.
U.S. Appl. No. 10/196,081 Notice of Allowance mailed May 25, 2005, 8 pgs.
U.S. Appl. No. 10/196,081 Notice of Allowance mailed Jun. 13, 2003, 18 pgs.
U.S. Appl. No. 10/196,081 Response filed Apr. 19, 2005 to Non Final Office Action mailed Jan. 25, 2005, 13 pgs.
U.S. Appl. No. 10/196,081 Response filed Apr. 23, 2003 to Non Final Office Action mailed Jan. 23, 2003, 10 pgs.
U.S. Appl. No. 10/196,081 Response filed Aug. 24, 2006 to Non Final Office Action mailed Jun. 12, 2006, 16 pgs.
U.S. Appl. No. 10/196,081 Response filed Oct. 15, 2004 to Non Final Office Action mailed Aug. 25, 2004, 11 pgs.
U.S. Appl. No. 10/196,081 Response filed Dec. 4, 2006 to Final Office Action mailed Oct. 4, 2006, 11 pgs.
U.S. Appl. No. 10/196,081, Notice of Allowance mailed Nov. 19, 2007, 7 pgs.
U.S. Appl. No. 10/721,920 Amendment Under 37 CFR 1.312 filed Dec. 23, 2006, 17 pgs.
U.S. Appl. No. 10/721,920 Notice of Allowance mailed Dec. 20, 2004, 20 pgs.
U.S. Appl. No. 10/721,920 Notice of Allowance mailed Dec. 20, 2005, 7 pgs.
U.S. Appl. No. 10/789,882 Notice of Allowance mailed Aug. 10, 2007, 7.
U.S. Appl. No. 10/842,042 Final Office Action mailed Mar. 29, 2007, 12 pgs.
U.S. Appl. No. 10/842,042 Final Office Action mailed Oct. 18, 2005, 14 pgs.
U.S. Appl. No. 10/842,042 Non Final Office Action mailed Feb. 24, 2005, 20 pgs.
U.S. Appl. No. 10/842,042 Non Final Office Action mailed May 3, 2006, 13 pgs.
U.S. Appl. No. 10/842,042 Non Final Office Action mailed Aug. 2, 2005, 13 pgs.
U.S. Appl. No. 10/842,042 Non Final Office Action mailed Oct. 17, 2006, 10 pgs.
U.S. Appl. No. 10/842,042 Non Final Office Action mailed Oct. 19, 2004, 21 pgs.
U.S. Appl. No. 10/842,042 Notice of Allowance mailed Jun. 12, 2007, 9 pgs.
U.S. Appl. No. 10/842,042 Response filed Jan. 4, 2007 to Non Final Office Action mailed Oct. 17, 2006, 14 pgs.
U.S. Appl. No. 10/842,042 Response filed May 19, 2005 to Non Final Office Action mailed Feb. 24, 2005, 14 pgs.
U.S. Appl. No. 10/842,042 Response filed May 23, 2007 to Final Office Action mailed Mar. 29, 2007, 11 pgs.
U.S. Appl. No. 10/842,042 Response filed Aug. 2, 2006 to Non Final Office Action mailed May 3, 2006, 15 pgs.
U.S. Appl. No. 10/842,042 Response filed Sep. 9, 2005 to Non Final Office Action mailed Aug. 2, 2005, 14 pgs.
U.S. Appl. No. 10/842,042 Response filed Nov. 23, 2004 to Non Final Office Action mailed Oct. 19, 2004, 14 pgs.
U.S. Appl. No. 10/842,042 Response filed Nov. 23, 2005 to Final Office Action mailed Oct. 18, 2005, 15 pgs.
U.S. Appl. No. 10/854,552 Final Office Action mailed Oct. 17, 2006, 12 pgs.
U.S. Appl. No. 10/854,552 Non Final Office Action mailed Feb. 23, 2007, 6 pgs.
U.S. Appl. No. 10/854,552 Non Final Office Action mailed Apr. 20, 2006, 29 pgs.

U.S. Appl. No. 10/854,552 Non Final Office Action mailed Aug. 8, 2007, 7 pgs.

U.S. Appl. No. 10/854,552 Response filed May 3, 2007 to Non Final Office Action mailed Feb. 23, 2007, 7 pgs.

U.S. Appl. No. 10/854,552 Response filed Jul. 20, 2006 to Non Final Office Action mailed Apr. 20, 2006, 10 pgs.

U.S. Appl. No. 10/854,552 Response filed Nov. 1, 2007 to Non-Final Office Action mailed Aug. 8, 2007, 7 pgs.

U.S. Appl. No. 10/854,552 Response filed Dec. 18, 2006 to Final Office Action mailed Oct. 17, 2006, 5 pgs.

U.S. Appl. No. 10/931,541 Final Office Action mailed Jan. 27, 2006, 25 pgs.

U.S. Appl. No. 10/931,541 Final Office Action mailed Dec. 12, 2006, 15 pgs.

U.S. Appl. No. 10/931,541 Non final Office Action mailed Jun. 21, 2006, 14 pgs.

U.S. Appl. No. 10/931,541 Non final Office Action mailed Aug. 10, 2005, 13 pgs.

U.S. Appl. No. 10/931,541 Notice of Allowance mailed Apr. 2, 2007, 8 pgs.

U.S. Appl. No. 10/931,541 Response filed Jan. 25, 2007 to Final Office Action mailed Dec. 12, 2006, 15 pgs.

U.S. Appl. No. 10/931,541 Response filed Mar. 27, 2006 to Final Office Action mailed Jan. 27, 2006, 15 pgs.

U.S. Appl. No. 10/931,541 Response filed Sep. 14, 2006 to Non Final Office Action mailed Jun. 21, 2006, 14 pgs.

U.S. Appl. No. 10/931,541 Response filed Nov. 10, 2005 to Non final Office Action mailed Aug. 10, 2005, 10 pgs.

U.S. Appl. No. 11/458,975 Notice of Allowance mailed Oct. 22, 2007, 7 pgs.

U.S. Appl. No. 10/195,165 Supplemental Notice of Allowability mailed Jul. 13, 2007, 6 pgs.

US 7,078,338, 07/2006, Ahn et al. (withdrawn)

METHOD FOR MAKING INTEGRATED CIRCUITS

RELATED APPLICATIONS

This application is a Continuation of U.S. application Ser. No. 09/484,303, filed Jan. 18, 2000, now U.S. Pat. No. 7,262,130 which is incorporated herein be reference.

TECHNICAL FIELD

The present invention concerns methods of semiconductor device or integrated circuit manufacturing, particularly methods of forming interconnects from copper and other metals.

BACKGROUND OF THE INVENTION

Integrated circuits, the key components in thousands of electronic and computer products, are interconnected networks of electrical components fabricated on a common foundation, or substrate. Fabricators typically use various techniques, such as layering, doping, masking, and etching, to build thousands and even millions of microscopic resistors, transistors, and other electrical components on a silicon substrate, known as a wafer. The components are then wired, or interconnected, together with aluminum wires to define a specific electric circuit, such as a computer memory. The aluminum wires are typically about one micron thick, or about 100 times thinner than a human hair.

To form the aluminum wires, fabricators sometimes use a dual-damascene metallization technique, which takes its name from the ancient Damascan metalworking art of inlaying metal in grooves or channels to form ornamental patterns. The dual-damascene technique entails covering the components on a wafer with an insulative layer of silicon dioxide, etching small holes in the insulative layer to expose portions of the components underneath, and subsequently etching shallow trenches from hole to hole to define a wiring pattern.

Etching the trenches and holes entails forming a mask, using photolithographic techniques, on the insulative layer. The masks, which typically consists of a material called photoresist, shields some portions of the insulative layer from the etchant and allows the etchant to dissolve away other portions. After etching, fabricators remove the mask to expose the patterned insulative layer. They then blanket the entire insulative layer with a thin sheet of aluminum and polish off the excess, leaving behind aluminum vias, or contact plugs, in the holes and thin aluminum wires in the trenches.

The complexity of some integrated circuits demand several interconnected levels of wiring. Some circuits, such as microprocessors, have five or six interconnected levels, with each level formed by repeating the basic dual-damascene produce. For example, to form a second wiring level, fabricators apply a new insulative layer over the first wiring layer, form another mask on the new layer, etch holes and trenches into the new layer, remove the mask, blanket the new layer with aluminum, before finally polishing off the excess to complete it.

In recent years, researchers have begun using copper instead of aluminum to form integrated-circuit wiring, because copper offers lower electrical resistance and better reliability at smaller dimensions. Fabrication of copper-wired integrated circuits sometimes follows an extension of the dual-damascene method which includes an additional step of lining the holes and trenches of an insulative layer with a copper-diffusion barrier before blanketing the layer with copper and polishing off the excess. (The diffusion barrier is generally necessary because copper atoms readily diffuse through common insulators, such as silicon dioxide, resulting in unreliable or inoperative integrated circuits.) Typically, the copper-diffusion barrier is more than 30 nanometers thick and consists of tantalum, tantalum nitride, tantalum-silicon-nitride, titanium nitride, or tungsten nitride. Filling the barrier-lined holes and trenches with copper generally entails depositing a thin copper seed layer on the copper-diffusion barrier, electroplating copper on the seed layer, and then polishing off the excess.

The present inventors identified at least two problems with using the extended dual-damascene technique for making the copper wiring. The first is that typical copper-diffusion barriers add appreciable resistance to the copper wiring, and thus negate some promised performance advantages. And, the second is that the number of separate procedures or steps necessary to make the copper wiring using the extended technique makes fabrication both costly and time consuming.

Accordingly, there is a need for better ways of making copper wiring for integrated circuits.

DESCRIPTION OF THE PREFERRED EMBODIMENTS

The following detailed description, which references and incorporates FIGS. 1-8, describes and illustrates specific embodiments of the invention. These embodiments, offered not to limit but only to exemplify and teach the concepts of the invention, are shown and described in sufficient detail to enable those skilled in the art to implement or practice the invention. Thus, where appropriate to avoid obscuring the invention, the description may omit certain information known to those of skill in the art.

Figure 1:
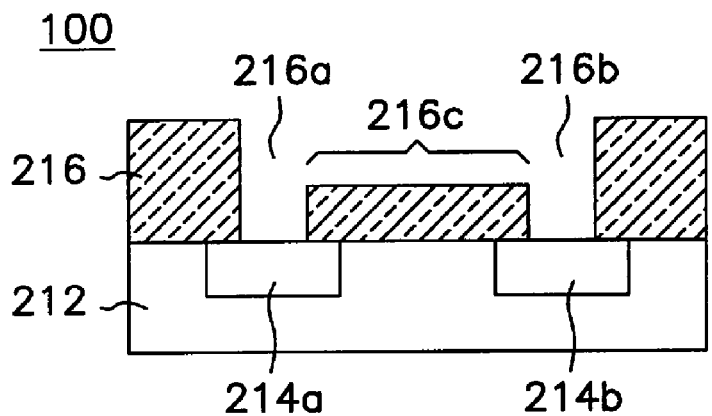
FIG. 1 is a cross-sectional view of an exemplary integrated-circuit assembly 100, including two transistors 214a and 214b and a mask layer 216 with via holes 216a and 216b, and a trench 216c.

FIGS. 1-7 show a number of cross-sectional views of a partial integrated-circuits assembly 100, which taken collectively and sequentially, illustrate a unique exemplary method of making integrated circuits, and more particularly making integrated-circuit wiring in accord with teachings of the present invention. The method, as shown in FIG. 1, begins with a known integrated-circuit assembly or structure 100, which can exist within any integrated circuit, a dynamic-random-access memory, for example. Assembly 100 includes a substrate 212. The term "substrate," as used herein, encompasses a semiconductor wafer as well as structures having one or more insulative, conductive, or semiconductive layers and materials. Thus, for example, the term embraces silicon-on-insulator, silicon-on-sapphire, and other advanced structures.

Substrate 212 supports a number of integrated elements 214, for example transistors 214a and 214b. Transistors 214a and 214b are covered by a mask layer 216, which, for example, comprises photoresist. In the exemplary embodiment, the transistors are metal-oxide-semiconductor field-effect transistors (MOSFETs); however, in other embodiments, the transistors are other types of field-effect transistors or bipolar junction transistors, or mixed transistor types. Still other embodiments use other types of integrated devices.

Layer 216 includes two exemplary via holes 216a and 216b positioned over respective contact regions (not shown) of transistors 214a and 214b and a trench 216c connecting the via holes. The exemplary embodiment forms layer 216 from photoresist, through use of spincoating, lithography, and photoresist remover. Some embodiments use plasma ashing to pattern the photoresist. Also, in the exemplary embodiment, via holes 216a and 216b are cylindrical with diameters of about 1000 nanometers and depths of about 500 nanometers. Trench 216c is less than 0.50 microns wide and at least one micron deep. The invention, however, is not limited to any particular mask material, formation technique, geometry, or dimensions.

Figure 2:
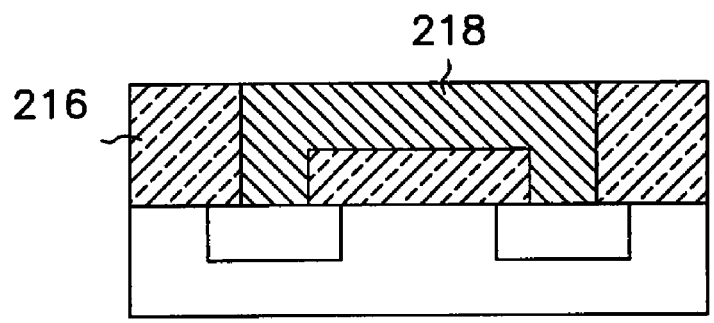
FIG. 2 is a cross-sectional view of the FIG. 1 assembly after formation of conductive structure 218 within holes 216a and 216b and trench 216c.

FIG. 2 shows that the exemplary method next forms a conductive structure 218 on mask 216, with one or more portions of the conductive structure contacting one or more exposed portions of the transistors. In the exemplary embodiment, this entails depositing a 20-30-nanometer-thick copper-, silver-, or gold-based seed layer (not shown separately) using a chemical-vapor-deposition, ionized-magnetron sputtering technique, or DC magnetron self-sputtering technique, and then electroplating additional copper-, silver-, or gold-based material on the seed layer to a total thickness of, for example, 0.5 microns. (As used herein, a copper-, silver-, or gold-based material includes at least 25 weight-percent of the base material.) An exemplary chemical-vapor-deposition technique follows a procedure such as that described in Y. Senzaki, "Chemical Vapor Deposition of Copper Using a New Liquid Precursor with Improved Thermal Stability," MRS Conference Proceedings of Advanced Metallization and Interconnect Systems for ULSI Applications in 1997, ULSI XIII, P. 451-455, 1998, which is incorporated herein by reference. This procedure yields copper films at a typical deposition rate of 150-170 nanometers per minute at wafer temperatures of 195-225° C. The resistance of these films is in the range of 2.0 micro-ohm-centimeter after annealing at 400° C. for five minutes.

Exemplary ionized sputtering technique and d-c magnetron sputtering techniques follow procedures similar to those outlined in S. M. Rossnagel et al., Metal Ion Deposition from Ionized Magnetron Sputtering Discharge," J. Vac. Sci. Technology B, 12(1), p. 449-453, 1994. And Z. J. Radzimski et al, "Directional Copper Deposition using D-C Magnetron Self-sputtering," J. Vac. Sci Technology B 16(3), p. 1102-1106, 1998. Exemplary conditions for the ionized-magnetron sputtering operation are: target power range of 10-30 kilowatts for a 200-300 millimeter diameter wafer (or integrated-circuit assembly), RF coil power at 3-5 kilowatts, negative DC bias of 100-200 volts, sputtering argon gas pressurized at 1-35 millitorrs. Ionized-magnetron sputtering, which provides greater acceleration of the metal deposition material than conventional sputtering, forces the sputtered material to more closely conform to the interior profiles of holes and trenches of the targeted surface.

Notably, the exemplary embodiment omits formation of an adhesion layer to promote adhesion of copper (or other materials) to the mask layer. Some embodiments use a 20-50 nanometer-thick layer of titanium nitride (TiN) over the transistor contacts as an adhesion layer and a diffusion barrier. However, other embodiments provide an adhesion layer of titanium nitride. After depositing the conductive material, the exemplary method removes excess material, for example, using a chemical-mechanical planarization or polishing procedure.

Figure 3:
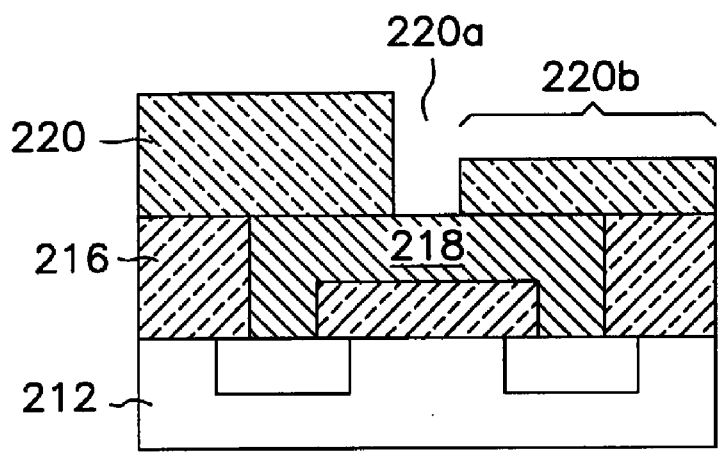
FIG. 3 is a cross-sectional view of the FIG. 2 integrated-circuit assembly after formation of a mask layer 220 on conductive structure 218.

Next, as FIG. 3 shows, the exemplary method forms a mask layer 220 over conductive structure 218. Mask layer 220 includes an opening (via) 220a which exposes a portion of conductive structure 218 and a trench 220b which intersects opening 220a. Exemplary formation of conductive structure follows a procedure similar to that used to form mask layer 216 and occurs with at least a portion of mask layer 216 still in place.

Figure 4:
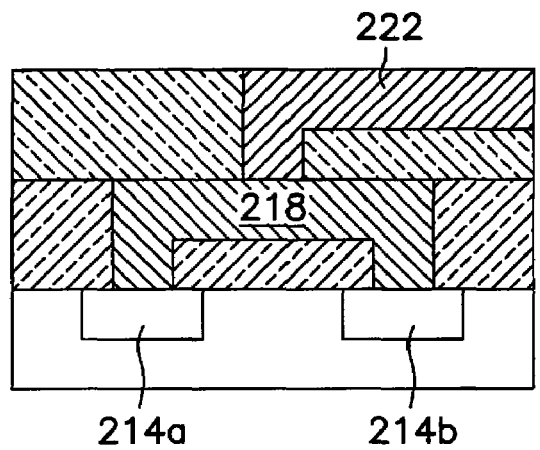
FIG. 4 is a cross-sectional view of the FIG. 3 assembly after formation of a conductive structure 222 on mask layer 220.

FIG. 4 shows that the exemplary method next forms a conductive structure 222 on mask 216, with portions of structure 222 contacting exposed portions of conductive structure 218. In the exemplary embodiment, this entails depositing a 20-30-nanometer-thick copper-, silver-, or gold-based seed layer and electroplating additional copper-, silver-, or gold-based material to an exemplary thickness of 0.5 microns. Excess material is then removed using a chemical-mechanical planarization or polishing procedure. Subsequently, one or more higher-level conductive structures can be formed similarly.

Figure 5:
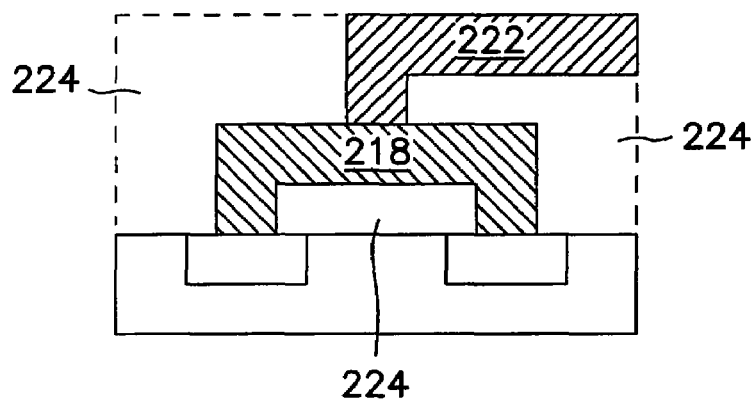
FIG. 5 is a cross-sectional view of the FIG. 4 assembly after removal of mask layers 116 and 220 to define space 224.
Figure 6:
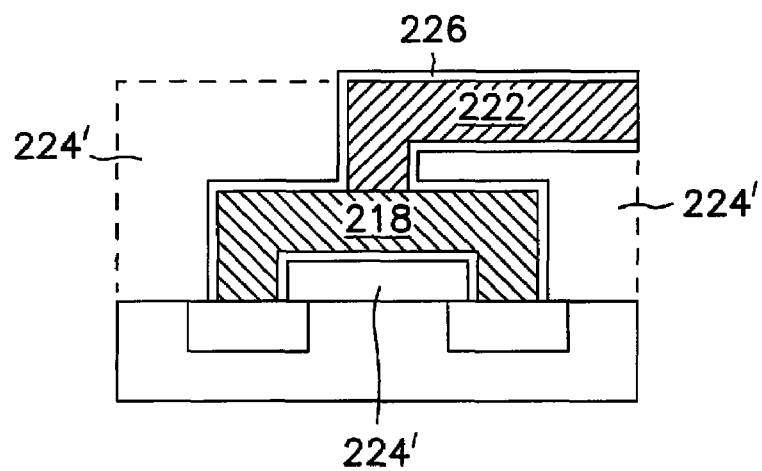
FIG. 6 is a cross-sectional view of the FIG. 5 assembly after forming a diffusion-barrier 226 on conductive structures 218 and 222.

FIG. 5 shows that after forming conductive structure 222, the method removes at least a portion of mask structures 216 and 220, defining one or more spaces or voids 224 around conductive structures 218 and 222. Without the surrounding masks, conductive structures 218 and 222 appears as a two-level airbridge. The exemplary embodiment removes substantially all of the mask structures by ashing them in an oxygen plasma.

After removal of the mask structures, the exemplary method forms a diffusion barrier 226 on at least portions of conductive structures 218 and 222. In the exemplary embodiment, this entails growing or depositing a two-to-six nanometer-thick layer of WSiN over substantially all of conductive structures 218 and 222. Exemplary formation of this layer of WSiN occurs within a hybrid reaction chamber such as that described in co-filed and co-assigned patent application entitled Methods and Apparatus for Making Copper Wiring in Integrated Circuits. This application, attorney docket 303.618US1 (99-0469), is incorporated herein by reference.

More particularly, exemplary formation of diffusion barrier 226 entails forming a graded composition of tungsten silicide ($WSi_x$), with x varying from 2.0 to 2.5. This entails heating the assembly to a temperature of 360° C. and introducing hydrogen, tungsten hexafluoride, and silane gases into a process chamber enclosing the assembly. The exemplary embodiment introduces the hydrogen and tungsten hexaflouride gases about one-to-three seconds before introducing the silane gas and stops introducing the silane gas about one-to-three seconds before stopping introduction of the hydrogen and tungsten hexaflouride. Exemplary flow rates for the silane and tungsten hexaflouride gases are respectively 1000 sccm and 14 sccm. These flow rates result in a composition of $WSi_{2.3}$, with a growth rate of approximately 50 nanometers per minute.

To complete the diffusion barrier, the exemplary method nitrides the graded composition of $WSi_x$, forming $WSi_xN_y$. The exemplary nitridation follows an electron-cyclotron-resonance (ECR) plasma nitridation procedure. One version of this procedure is described in A. Hirata et al., WSiN Diffusion Barrier Formed by ECR Plasma Nitridation for Copper Damascene Interconnection, Extended Abstracts of 1998 International Conference on Solid State Devices and Materials, p. 260-261, which is incorporated herein by reference. This entails introducing nitrogen gas and argon gas into the chamber, with the argon gas exciting a plasma. In the exemplary embodiment, the $WSi_xN_y$ is not a compound-forming barrier, but a stuffed barrier, which prevents diffusion by stuffing nitrogen atoms into diffusion paths, such as interstitial sites, within the tungsten silicide. Other embodiments uses diffusion barriers having different compositions and thicknesses, and some entirely omit a diffusion barrier.

Figure 7:
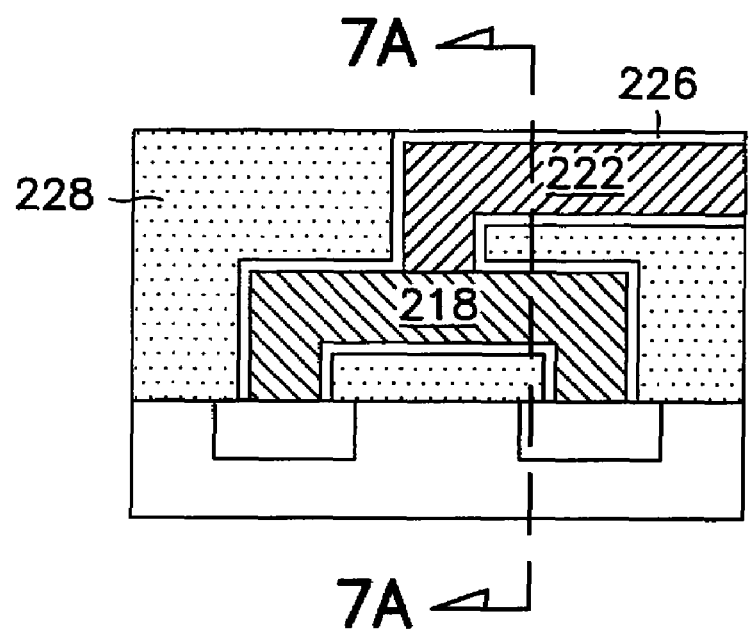
FIG. 7 is a cross-sectional view of the FIG. 6 assembly after filling space 224 with one or more insulative materials to form a two-level insulative structure 228.
Figure 7A:
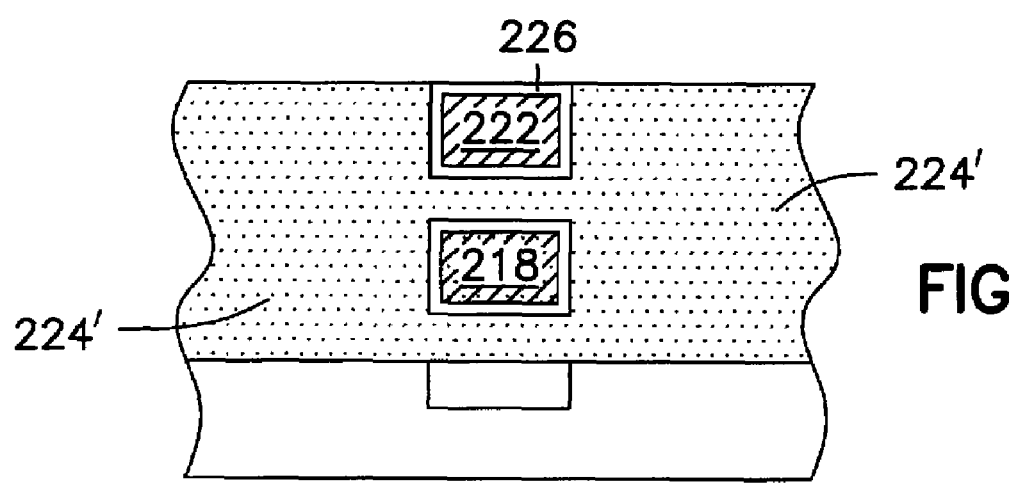

FIG. 7 shows that after completion of diffusion barrier 226, the exemplary method fills at least a portion of the remainder of space 224 (denoted 224' in FIG. 6) with one or more insulative materials to form a two-level insulative structure 228. The exemplary embodiment fills substantially all of space 224, which was previously occupied by mask structures 216 and 220, with a single dielectric material using a single procedure. More particularly, the exemplary embodiment vapor deposits a silicon oxide, such as $SiO_2$, or low-k (that is, low-dielectric-constant) materials, such as xerogels or aerogels. Various methods, such as physical-vapor deposition, chemical-vapor deposition, spin-coating, sol-gel procedures, and so forth can be used to apply these dielectrics.

Figure 8:
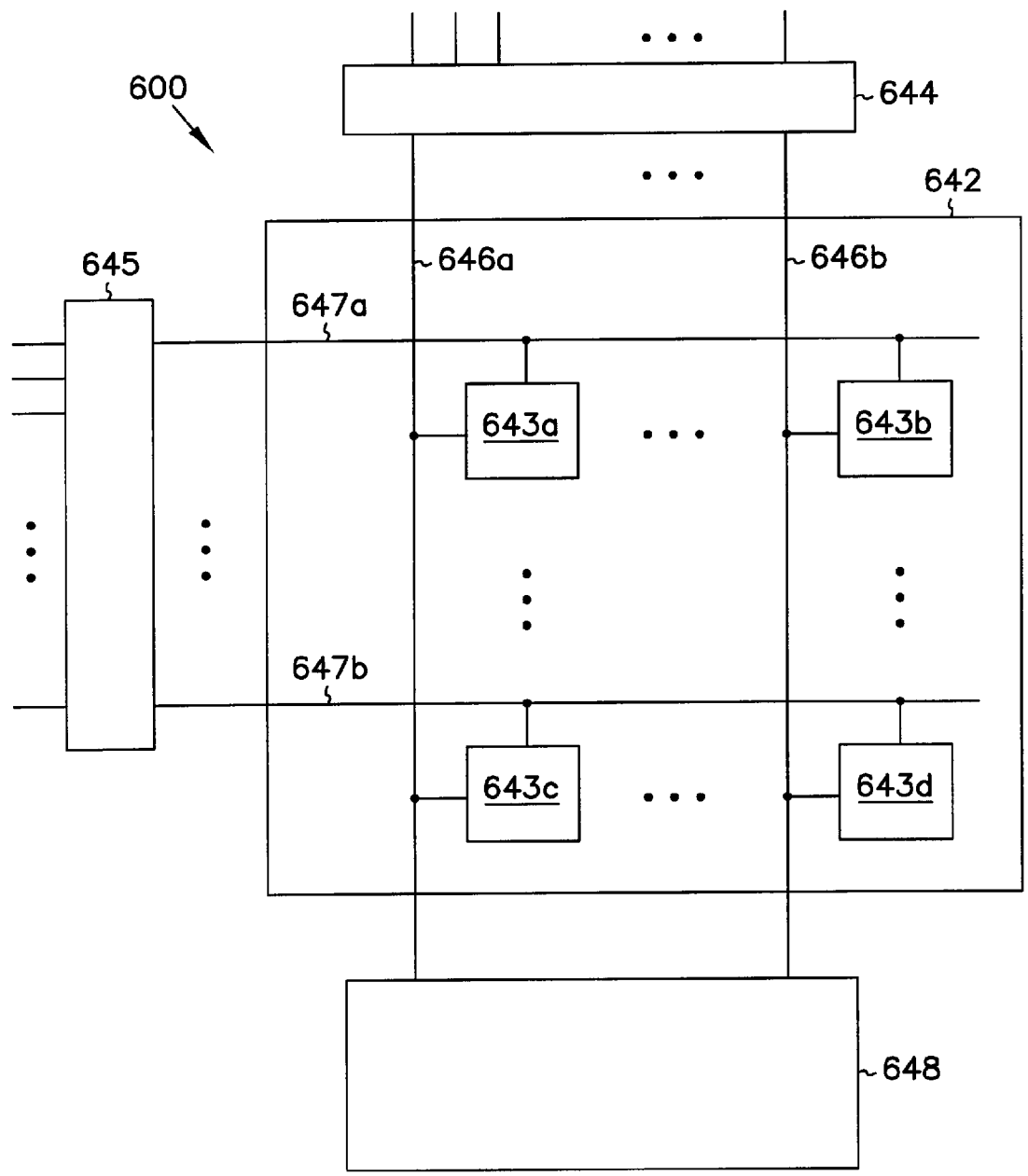
FIG. 8 is a block diagram of an exemplary integrated memory circuit which incorporates the present invention.

FIG. 8 shows one example of the unlimited number of applications for one or more embodiments of the present invention: a generic integrated memory circuit 600. Circuit 600, which operates according to well-known and understood principles, is generally coupled to a processor (not shown) to form a computer system. More precisely, circuit 600 includes a memory array 642 which comprises a number of memory cells 643a-643d, a column address decoder 644, and a row address decoder 645, bit lines 646, word lines 647, and voltage-sense-amplifier circuit 648 coupled to bit lines 646.

To address these and other needs, the inventors devised unique methods of forming wiring from copper and other desirable metals, some of which allow fabrication of copper wiring with fewer steps and lower electrical resistance than some conventional methods. One exemplary method forms a first mask layer with openings that expose underlying transistor contact regions and then forms on the first mask layer a first metal structure of for example, copper, silver, or gold-based metals, which contacts the transistor contact regions. Next, with the first mask layer still in place, the exemplary method forms a second mask layer with openings that expose portions of the underlying first metal structure and then forms on the second mask structure a second metal structure which contacts exposed portions of the first metal structure.

After formation of these mask layers and metal structures, the exemplary method removes both mask layers in a single removal procedure, leaving a space around and between the metal structures. The first and second metal structures are then coated in a single procedure with a 6-10-nanometer-thick diffusion barrier, such as $WSi_xN_y$ (tungsten-silicon-nitrogen.) And subsequently, the space is filled, in another single procedure, with one or more insulative materials, such as silicon dioxide, an aerogel, or an xerogel.

In the exemplary embodiment, each of the memory cells, the address decoders, and the amplifier circuit includes one or more copper-, silver-, or gold-based conductors according to the present invention. Other embodiments, use conductors of other materials, made in accord with one or more methods of the present invention. In addition, connections between the address decoders, the memory array, the amplifier circuit are implemented using similar interconnects.

CONCLUSION

In furtherance of the art, the inventors have one or more exemplary methods for making integrated-circuit wiring from materials, such as copper-, silver-, and gold-based metals, some of which allow fabrication of wiring with fewer steps and lower electrical resistance than some conventional methods. One exemplary method initially forms a first mask and a first metal structure on the first mask and then forms a second mask and a second metal structure on the second mask, with the first mask and first metal structure still in place. Continuing, this exemplary method removes both masks in a single removal procedure, forms a diffusion barrier to both metal structures in a single formation procedure, and fills insulative material in and around both metal structures in a single fill procedure. Applying one or more procedures across multiple wiring levels, as in this embodiment, ultimately precludes the necessity of applying these procedures separately to each wiring level and thus promises to simplify fabrication.

The embodiments described above are intended only to illustrate and teach one or more ways of practicing or implementing the present invention, not to restrict its breadth or scope. The actual scope of the invention, which embraces all ways of practicing or implementing the invention, is defined only by the following claims and their equivalents.

The invention claimed is:

1. A method of making an integrated circuit, comprising:
   forming a first mask layer having a first plurality of openings on a semiconductor substrate having at least one transistor structure and an insulator layer having a predetermined vertical thickness to form an access to selected portions of the at least one transistor;
   forming a second mask layer having a second plurality of openings;
   removing a portion of the insulator layer to expose the selected portions of the at least one transistor;
   forming a first conductive material layer in the first and second plurality of openings;
   forming a second conductive material layer disposed upon the first conductive material and extending upward to a top surface of the second mask layer;
   removing substantially all of the first and second mask layers; and
   forming a diffusion barrier layer on substantially all portions of the first and second conductive materials not directly in contact with one of the selected portions of the at least one transistor and the insulator layer.

2. The method of claim 1, wherein the insulator layer has a thickness of zero.

3. The method of claim 1, wherein the second plurality of openings includes laterally extending trenches, at least some of the trenches connecting individual ones of the first plurality of openings.

4. The method of claim 1, wherein removing the first and second mask layers is performed in a single operation.

5. The method of claim 1, wherein removing the first and second mask layers results in an air bridge structure.

6. The method of claim 1, wherein forming the diffusion barrier layer includes tungsten silicide.

7. The method of claim 1, wherein the forming a second conductive material layer extending upward to a top surface of the second mask layer includes at least one of sputter deposition, ionized magnetron sputtering, DC magnetron sputtering, evaporation deposition, chemical vapor deposition, electroplating, electroless plating and chemical-mechanical polishing.

8. The method of claim 1, wherein at least one of the first and second conductive material is selected from at least one of gold, silver, copper, titanium, tungsten, alloys thereof, silicides thereof, nitrides thereof, and combinations thereof.

9. The method of claim 6, wherein the diffusion barrier layer includes forming a graded composition of tungsten silicon nitride with the nitrogen composition varying from substantially zero at an interface of the diffusion barrier with the first and second conductive materials.

10. The method of claim 6, wherein the diffusion barrier is formed by introducing tungsten hexafluoride and hydrogen gas into a processing chamber at a selected temperature and pressure, introducing silane gas into the processing chamber after the tungsten hexafluoride gas has substantially filled the processing chamber, and terminating the flow of silane before terminating the flow of the tungsten hexafluoride.

11. A method of making an integrated circuit, comprising:
    forming a first mask layer having a first plurality of openings;
    forming a second mask layer having a second plurality of openings;
    forming a first conductive material layer having a thickness of from 20 to 30 nanometers in the first and second plurality of openings;
    forming a second conductive material layer having a thickness of from 300 to 600 nanometers upon the first conductive material and extending upward to a top surface of the second mask layer;
    forming a third mask layer having a third plurality of openings;
    forming a fourth mask layer with a fourth plurality of opening;
    forming a third conductive material in the third and fourth plurality of openings and contacting the second conductive material;
    forming a fourth conductive material upon the third conductive material and extending upward to a top surface of the fourth mask layer;
    removing substantially all of the first, second, third and fourth mask layers; and
    forming a diffusion barrier layer on substantially all portions of the first, second, third and fourth conductive materials not directly in contact with one of the integrated circuit, remaining portions of the first, second, third and fourth mask layers, and portions of other ones of the first, second, third and fourth conductive materials.

12. The method of claim 11, wherein the first plurality of openings include contacts to portions of the integrated circuit, the second plurality of openings include trench connections between selected ones of the contacts, the first and second pluralities form a first metallization level, the third plurality of openings include vias between a second metallization level and the first metallization level, and the fourth plurality of openings include trench connection between selected ones of the vias and between selected vias and input and output connects disposed to form connections to external circuits.

13. The method of claim 11, wherein removing portions of the first, second, third and fourth mask layers is performed in a single operation.

14. The method of claim 11, wherein further after forming the first conductive material, forming an adhesion promoter layer prior to forming the second conductive material.

15. The method of claim 11, wherein the forming of at least one of the second and fourth conductive material layers includes at least one of sputter deposition, ionized magnetron sputtering, DC magnetron sputtering, evaporation deposition, chemical vapor deposition, electroplating, electroless plating and chemical-mechanical polishing.

16. The method of claim 11, wherein at least one of the first, second, third and fourth conductive material is selected from at least one of gold, silver, copper, titanium, tungsten, alloys thereof, silicides thereof, nitrides thereof, and combinations thereof.

17. The method of claim 13, wherein the single operation includes at least one of plasma ashing, plasma etching, solvent striping, chemical dissolution and thermal decomposition.

18. The method of claim 17, wherein the removing operation removes substantially all of the mask layers over, under and surrounding the first and second metallization levels and forms air bridge electrical connections having a dielectric constant approximately equal to one.

19. The method of claim 18, wherein the removing operation creates a void between a majority of all surfaces of the first, second, third and fourth conductive materials, and the void is substantially filled with at least one of an aerogel, silicon dioxide, xerogel, polyimide, siloxanes and silicon oxynitrides.

20. The method of claim 14, wherein the adhesion promoter layer includes titanium nitride.

21. A method of making an integrated circuit, comprising:
    forming a first patterned mask layer;
    forming a second patterned mask layer;
    forming a first conductive material layer in openings of the first and second patterned mask layers;
    forming a third patterned mask layer;
    forming a fourth patterned mask layer;
    forming a second conductive material in openings in the third and fourth patterned mask layers;
    removing substantially all of the first, second, third and fourth mask layers; and
    forming a diffusion barrier layer on substantially all surfaces of the first and second conductive materials.

22. The method of claim 21, wherein the first conductive material has an upper surface that is approximately equal to a top surface of the second patterned mask layer.

23. The method of claim 21, wherein the second conductive material has an upper surface that is approximately equal to a top surface of the fourth patterned mask layer.

24. The method of claim 21, wherein the second conductive material is planarized by chemical mechanical polishing to a level approximately equal to a top surface of the second patterned mask layer.

25. The method of claim 21, wherein forming a first conductive material layer in openings of the first and second patterned mask layers forms a first metallization level connecting portions of the integrated circuit; and
    the forming a second conductive material in openings in the third and fourth patterned mask layers forms a second metallization level connecting portions of the first metallization level, and connecting portions of the integrated circuit to input and output circuits.

26. The method of claim 21, wherein a single operation removes the first, second, third and fourth patterned mask layers.

27. The method of claim 21, wherein further after forming the diffusion barrier, a void formed by the removing of the first, second, third and fourth patterned mask layers is substantially filled with at least one of an aerogel, silicon dioxide, xerogel, polyimide, siloxanes and silicon oxynitrides.

28. The method of claim 21, wherein further forming the first conductive layer includes forming a first metal layer, forming an adhesion promoter layer comprising titanium nitride, and forming a second metal layer on the first metal layer.

29. The method of claim 21, wherein the forming of at least one of the first and second conductive material layers includes at least one of sputter deposition, ionized magnetron sputtering, DC magnetron sputtering, evaporation deposition, chemical vapor deposition, electroplating, electroless plating and chemical-mechanical polishing.

30. The method of claim 21, wherein at least one of the first and second conductive materials is selected from at least one of gold, silver, copper, titanium, tungsten, alloys thereof, silicides thereof, nitrides thereof, and combinations thereof.

* * * * *